US010115386B2

(12) United States Patent
Chan et al.

(10) Patent No.: US 10,115,386 B2
(45) Date of Patent: Oct. 30, 2018

(54) DELAY TECHNIQUES IN ACTIVE NOISE CANCELLATION CIRCUITS OR OTHER CIRCUITS THAT PERFORM FILTERING OF DECIMATED COEFFICIENTS

(75) Inventors: Kwokleung Chan, San Digeo, CA (US); Ren Li, San Diego, CA (US); Hyun Jin Park, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 12/621,156

(22) Filed: Nov. 18, 2009

(65) Prior Publication Data

US 2011/0116654 A1 May 19, 2011

(51) Int. Cl.

*H03G 11/00* (2006.01)
*G10L 21/0208* (2013.01)
*G10K 11/178* (2006.01)

(52) U.S. Cl.

CPC .... *G10K 11/178* (2013.01); *G10K 2210/3051* (2013.01)

(58) Field of Classification Search

CPC .............................................. G10K 2210/3051
USPC ......... 381/94.1, 94.2, 94.4, 94.8, 71.1, 71.2, 381/71.8, 71.11, 97, 98
See application file for complete search history.

(56) References Cited

U.S. PATENT DOCUMENTS 5,475,710 A * 12/1995 Ishizu et al. .................. 375/232
6,161,118 A 12/2000 Lu
6,829,629 B1 12/2004 Magesacher et al.
7,302,459 B2 11/2007 Bossmeyer et al.
7,365,669 B1 4/2008 John et al.
7,454,353 B2 11/2008 Sperschneider et al.
2004/0146168 A1* 7/2004 Goubran ............. G10K 11/175 381/73.1

(Continued)

FOREIGN PATENT DOCUMENTS

CN 101257729 A 9/2008
EP 1970902 A2 9/2008

(Continued)

OTHER PUBLICATIONS

International Search Report and Written Opinion—PCT/US2010/054147, International Search Authority—European Patent Office—dated Feb. 18, 2011.

(Continued)

*Primary Examiner* — George C Monikang
(74) *Attorney, Agent, or Firm* — Kilpatrick Townsend & Stockton, LLP

(57) ABSTRACT

This disclosure describes circuit configurations that may be used for active noise cancellation in the digital domain. In particular, this disclosure proposes the use a down sample unit and an up sample unit, rather than memory-based delay circuits, to achieve one or more desired delays in digital adaptive noise cancellation circuits or other circuits that use delay for signal processing. The delay achieved by the down sample unit and the up sample unit may be tunable so as to allow flexibility in producing the necessary delay for different active noise cancellation circuit configurations. Many different adaptive noise cancellation circuit configurations are discussed, and the techniques may also be useful for other types of circuits, such as low-latency equalization circuits.

37 Claims, 21 Drawing Sheets

(56) References Cited

U.S. PATENT DOCUMENTS

| | | | | |
|---|---|---|---|---|
| 2006/0013422 | A1* | 1/2006 | Goorevich | H04R 25/00 381/312 |
| 2006/0227897 | A1 | 10/2006 | Hasegawa | |
| 2006/0282262 | A1* | 12/2006 | Vos et al. | 704/219 |
| 2008/0032642 | A1* | 2/2008 | Singerl | H03F 1/3247 455/114.3 |
| 2008/0212791 | A1 | 9/2008 | Asada et al. | |
| 2009/0046822 | A1* | 2/2009 | Holmberg et al. | 375/373 |

FOREIGN PATENT DOCUMENTS

| | | | |
|---|---|---|---|
| EP | 2101506 | A2 | 9/2009 |
| JP | S6447117 | A | 2/1989 |
| JP | 03006919 | A | 1/1991 |
| JP | H04339500 | A | 11/1992 |
| JP | H0764582 | A | 3/1995 |
| JP | H10283003 | A | 10/1998 |
| JP | 2001282254 | A | 10/2001 |
| JP | 2003037641 | A | 2/2003 |
| JP | 2005128175 | A | 5/2005 |
| JP | 2006295501 | A | 10/2006 |
| JP | 2009094763 | A | 4/2009 |
| WO | WO2007095664 | A1 | 8/2007 |

OTHER PUBLICATIONS

Mehr A. S., "Alias-component matrices of multirate systems", IEEE Transactions on Circuits and Systems II : Express Briefs, May 12, 2009 (May 12, 2009), pp. 489-493, XP002620290.
Donadio M.P., "CIC Filter Introduction", pp. 1-6, Jul. 18, 2000.
Kuo S.M., et al., "Active Noise Control: A Tutorial Review", Proceedings of the IEEE, vol. 87, No. 6, pp. 943-973, Jun. 1999.
Djadi., Y., et al., "A High Throughput Programmable Decimation and Interpolation Filter", The Proceedings of the 5th International Conference on Signal Processing Applications & Technology, Oct. 18-21, 1994, pp. 1743-1748.
Jovanovic Dolecek and Fred Harris, "Design of CIC, Compensator Filter in a Digital IF Receiver", 2008 IEEE.
Gordana Jovanovic Dolecek and Fred Harris, "On Design of Two-Stage CIC Compensation Filter", IEEE International Symposium on Industrial Electronics, ISIE 2009.
Vishal Awasthi & Trishla Devi Gupta, "Analysis of Cascaded Integrator Comb (CIC) Decimation Filter in Efficient Compensation", International Journal of Electronics Engineering, 3 (2), 2011, pp. 203-208, ISSN: 0973-7383.

* cited by examiner

DELAY TECHNIQUES IN ACTIVE NOISE CANCELLATION CIRCUITS OR OTHER CIRCUITS THAT PERFORM FILTERING OF DECIMATED COEFFICIENTS

TECHNICAL FIELD

The disclosure relates to signal processing techniques, especially PDM domain signal processing and, more particularly but not restricted to, active noise cancellation in the digital domain for audio applications.

BACKGROUND

Active noise cancellation circuits may be used in a variety of applications, such as personal communication systems, wireless communication devices, digital media players, and audio output devices, such as headphones. Active noise cancellation systems actively reduce acoustic noise of the environment by generating so-called "anti-noise" which may be the inverse form of the noise in the surrounding environment. Active noise cancellation systems generally comprise one or more microphones that capture environmental noise signals, a circuit that generates anti-noise, and one or more speakers to play the anti-noise in order to cancel the environmental noise. The anti-noise may destructively interfere with the surrounding environmental noise and thereby reduce the noise signal that reaches the ear of the user.

Conventional active noise cancellation circuits are often implemented via analog signal processing. This is because analog circuits have very short processing delays relative to digital circuits. However, analog signal processing has disadvantages in that it is difficult to make analog signal processing configurable or adaptive.

Active noise cancellation may be performed in the digital domain via signal filtering. The signal filtering may occur in stages that introduce different levels of filtering. Conventional filtering in digital active noise cancellation circuits may require memory-based delay circuits between the filter stages. These memory-based delay circuits can become very large in terms of memory space in the circuit, particularly when signals are oversampled.

SUMMARY

This disclosure describes circuit configurations that may be used for active noise cancellation in the digital domain. This disclosure describes the use of a down sample unit and an up sample unit, rather than memory-based delay circuits, to achieve one or more desired delays in digital adaptive noise cancellation circuits. The delay achieved by the down sample unit and the up sample unit may be tunable so as to allow flexibility in producing the necessary delay for different active noise cancellation circuit configurations. Many different adaptive noise cancellation circuit configurations are discussed, including hybrid circuits that filter samples within two or more different sample rate domains. The delay techniques may also be used in other circuits (i.e., circuits that do not perform active noise cancellation). For example, the delay techniques using a down sample unit and an up sample unit, rather than memory-based delay circuits, may also be used in low-latency equalization circuits or other circuits.

In one example, this disclosure describes an apparatus comprising a down sample unit, and an up sample unit. The down sample unit and the up sample unit are each tuned such that a combined delay associated with processing a sample via the down sample unit and the up sample unit corresponds to a pre-defined delay. In some cases, the pre-defined delay may be selected to promote active noise cancellation.

In another example, this disclosure describes a method comprising processing a sample via a down sample unit and an up sample unit, wherein a combined delay associated with processing a sample via the down sample unit and the up sample unit corresponds to a pre-defined delay, such as a pre-defined delay that is selected to promote active noise cancellation.

In another example, this disclosure describes a device comprising means for down sampling, and means for up sampling, wherein the means for down sampling and the means for up sampling are each tuned such that a combined delay associated with down sampling and up sampling corresponds to a pre-defined delay. In some cases, pre-defined delay may be selected to promote active noise cancellation.

Aspects of the techniques described in this disclosure may be implemented in hardware, software, firmware, or combinations thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium and loaded and executed in the processor.

Accordingly, this disclosure also contemplates a computer-readable storage medium comprising instructions that upon execution in a processor cause the processor to perform active noise cancellation, wherein the instructions cause the processor to process a sample via a down sample unit and an up sample unit, wherein a combined delay associated with processing a sample via the down sample unit and the up sample unit corresponds to a pre-defined delay that is selected to promote active noise cancellation. The combined delay may comprise a tunable parameter of a circuit that includes the down sample unit and the up sample unit, wherein the instructions cause the processor to select the tunable parameter.

The details of one or more aspects of the disclosure are set forth in the accompanying drawings and the description below. Other features, objects, and advantages of the techniques described in this disclosure will be apparent from the description and drawings, and from the claims.

DETAILED DESCRIPTION

This disclosure describes circuit configurations that may be used for active noise cancellation in the digital domain. The described circuits may be used in a wide variety of active noise cancellation settings or applications, such as in personal communication systems, digital media players, wireless communication devices, and audio output devices, such as headphones. Active noise cancellation actively reduces acoustic noise of the environment by generating so-called “anti-noise” which may comprise audio signals that are the inverse form of the noise in the surrounding environment. Active noise cancellation systems generally comprise one or more microphones to pick up external noise signal, an active noise cancellation circuit to generate the anti-noise, and one or more speakers to play the anti-noise that cancels the environmental noise. The anti-noise generated by the active noise cancellation circuit may destructively interfere with the surrounding background noise and thereby reduce the noise signal that reaches the ear of the user.

Although the delay techniques of this disclosure are primarily described in the context of active noise cancellation, the delay techniques may also be used in other circuits (i.e., circuits that do not perform active noise cancellation). For example, the delay techniques using a down sample unit and an up sample unit, rather than memory-based delay circuits, may also be used in low-latency equalization circuits or other circuits.

Conventional active noise cancellation in the digital domain may use memory-based delay circuits between one or more stages of a digital active noise cancellation circuit. This disclosure describes the use of a down sample unit and an up sample unit, rather than memory-based delay circuits, to achieve one or more desired delays in digital adaptive noise cancellation circuits. The delay achieved by the down sample unit and the up sample unit may be tunable so as to allow flexibility in producing the necessary delay for different active noise cancellation circuit configurations. Many different adaptive noise cancellation circuit configurations are discussed, including hybrid circuits that filter samples within two or more different sample rate domains. To the extent that the down sample unit and the up sample unit themselves include memory delay elements, the memory delay elements in the down sample unit and the up sample unit may be significantly less than the memory required for conventional memory based delay circuits.

Figure 1A:
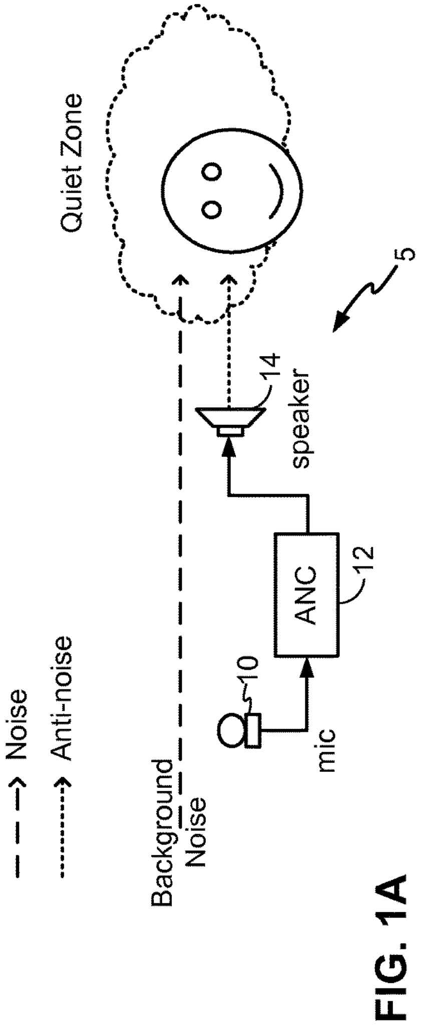
FIG. 1A is a conceptual diagram showing application of an active noise cancellation system.

FIG. 1A is a conceptual diagram showing application of an active noise cancellation system 5. Active noise cancellation system 5 may comprise one or more microphones 10 that capture background noise, an active noise cancellation (ANC) circuit 12 that generates anti-noise, and a speaker device 14 that outputs the anti-noise. Speaker 14 may also output additional audio (such as music). The anti-noise that is output by speaker 14 may be the inverse of the background noise insofar as the anti-noise substantially interferes with the background noise in a destructive fashion. The combination of the background noise in the surrounding environment and the anti-noise output by speaker device 14 may define a quiet zone, as conceptually illustrated as “quiet zone” in FIG. 1A around a user, i.e., a human listener.

Figure 1B:
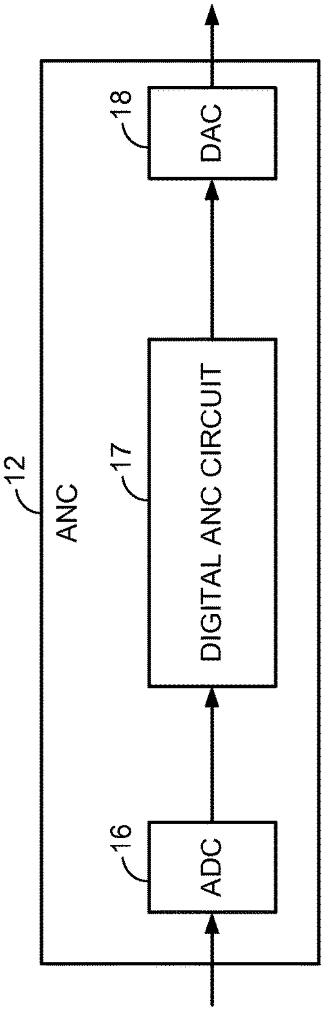
FIG. 1B is a block diagram showing an example of the active noise cancellation circuit of FIG. 1A.

FIG. 1B is a block diagram illustrating an example ANC circuit 12 in greater detail. As shown in FIG. 1B, ANC circuit 12 operates in a digital domain and includes an analog-to-digital converter (ADC) 16, a digital ANC circuit 17, and a digital to analog converter (DAC) 18. The techniques of this disclosure are applicable to digital ANC circuit 17 of ANC circuit 12. ADC 16 could alternatively form part of microphone 10, in which case the microphone may be referred to as a digital microphone that outputs pulse code modulation (PCM) samples. Also, DAC 18 could form part of speaker device 14, in which case the output of ANC 12 would be in the digital domain.

In the example shown in FIG. 1B, the output of ADC 16 may comprise PCM samples. In the context of audio coding, PCM samples may comprise digital samples that represent an audio waveform in the time domain as a series of amplitudes. Digital ANC 17 filters the digital samples of background noise to create anti-noise useful for active noise cancellation. In particular, digital ANC 17 filters the received background noise in order to generate anti-noise.

Figure 2:
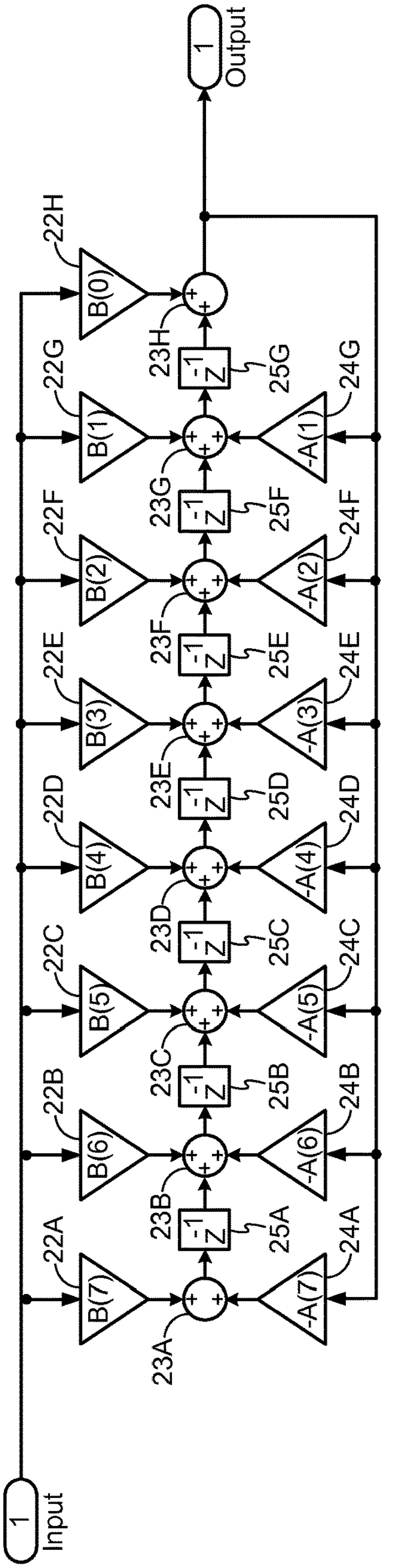
FIG. 2 is a circuit diagram of an active noise cancellation circuit that uses memory based delay elements.

Ordinary digital filters for PCM samples typically require a one-sample delay between successive filter stages (sometimes called filter tap stages). Each filter stage may perform an incremental amount of filtering and combine such filtering to a feedback signal. To achieve the one-sample delays between filter stages, memory delay circuits may be used. FIG. 2 illustrates an exemplary ANC circuit that uses memory delay circuits between successive filter stages. The input samples, in this case PCM samples, are received by amplifiers 22A-22H. The output samples of the circuit are fed back to amplifiers 24A-24G. Amplifiers 22A-22H and amplifiers 24A-24G may define the application of filter taps to the samples. For example, amplifiers 22A-22H and amplifiers 24A-24G may comprise digital multiplier circuits that multiply the input signal by a gain factor. The gain factors may be selected to achieve the desired signal amplification needed for active noise cancellation.

Adders 23A-23H combine the output of amplifiers 22A-22H with the output of amplifiers 24A-22G and memory based delay circuits 25A-25G, respectively, as illustrated. Memory based delay circuits 25A-25G provide one sample delays between each successive stage of the circuit, as the samples are processed. Thus, the different stages of the circuit are separated by memory based delay circuits 25A-25G. An input sample is filtered by each filter stage, but as a given sample moves through the stages along memory based delay circuits 25A-25G, the filtering accumulates to provide a desirable anti-noise effect in the output.

As noted herein, such memory based delay circuits 25A-25G may be undesirable from an implementation standpoint. In some cases, PCM samples may be further up sampled into pulse density modulation (PDM) samples, which typically have smaller bit depths than PCM samples. In typical applications, PDM samples from an analog-digital-converter may have bit depths of 1 to 4 bits. PDM sample representation of the signal typically uses a higher sampling rate than the signal band width, and the typical oversampling ratio (e.g., the ratio between over sampling rate and a sampling rate of the base band signal) may range between approximately 64 and 256. In some cases, PDM samples after analog-to-digital conversion can have larger bit depths than PCM samples bit for signal processing.

The approach of FIG. 2 may become undesirable when the number of filter taps becomes very large. Therefore, it may be better to use a decimated filter structure, such as that shown in FIG. 3 where only N filter taps are needed, while inserting K delays between such filter taps. This decimated filter structure of FIG. 3 may achieve equivalent filtering operations up to the baseband frequency, and may have a repeating response pattern in the higher frequencies after the baseband frequency.

Figure 3:
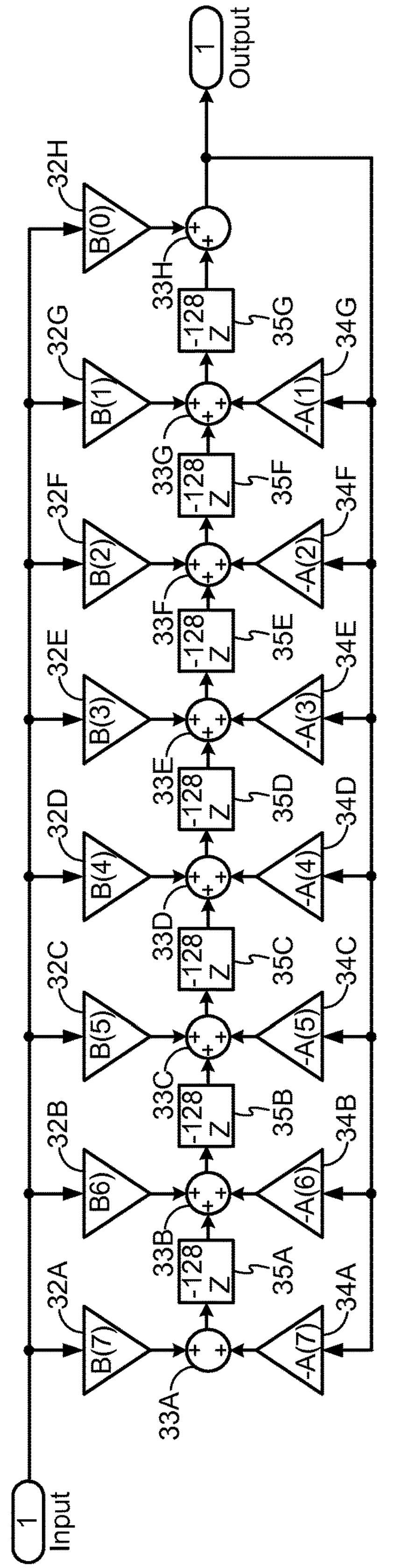
FIG. 3 is another circuit diagram of an active noise cancellation circuit that uses memory based delay elements.

The circuit of FIG. 3, like that of FIG. 2, includes a first set of amplifiers 32A-32H that receive the input samples, and a second set of amplifiers 34A-34G that receive the output of the circuit as feedback. Adders 33A-33H combine the filtered samples, as shown in FIG. 3 and memory-based delay circuit 35A-35G provide the delay needed between filter stages to achieve active noise cancellation in the PDM domain. The circuits described herein have exemplary numbers of stages and amplifiers, but different numbers of filter stages and amplifiers could be used for other configurations consistent with this disclosure.

An oversampling ratio may refer to the ratio between PDM signal sampling rate and the base band signal sampling rate. For example, typical PDM representation of 8 kHz base band signal can use 2048 kHz sampling rate where the oversampling ratio is 256. In such a case, a digital filter with 1 sample delay between taps can have effects over the whole 1024 kHz band width, while the signal of interest only spans up to 4 kHz. It may be desirable to use decimated filter structure which uses multiple sample delay between filter taps. By using a 256 delay between taps, the filter can still have full control up to full signal band width (4 kHz), but one can reduce the number of multipliers and adders by a factor of 1 to 256. The necessary delay for signals by memory based delay circuits 35A-35G may be a function of the oversampling ratio and the base band sampling frequency. Therefore, the required memory size can become very large when the audio sampling frequency and oversampling frequency are high. In addition, a filtering circuit that uses such memory-based delay circuits 35A-35G may have stability problems due to the limited word length of the filter coefficients associated with amplifiers 32A-32H and 34A-34G, and the input data. Limited word length means the bit-width of the coefficients are not large enough in real scenarios. The bit-width (i.e., bit depth) of the coefficients or data can proportionally increase the silicon area needed to fabricate the circuit in a chip. Therefore, it may be undesirable to use very large bit-widths in real applications. However, when bit width is not big enough, the coefficients or data can have relatively lower resolution, which can add a lot of quantization error or quantization noise to the data.

The circuits in both FIG. 2 and FIG. 3 can operate in PCM domain and PDM domain. The circuit in FIG. 2 may have a filtering effect over the full bandwidth of the input signal. The circuit of FIG. 3 may have a filtering effect $1/128^{th}$ of the input signal band width. In the case of FIG. 3, the same filtering effect can be repeated 127 times over the remaining band width. The circuit in FIG. 3 may be useful when input signal band width is a small fraction ($1/128$) of the sampling frequency. For example, when the band width by the sampling frequency is 512 KHz and the signal band width is only 4 KHz, a delay of 128 samples can be inserted between filter taps as shown in FIG. 3. Without this, one may need 127 times more multipliers and adders to the filter circuit.

Figure 4:
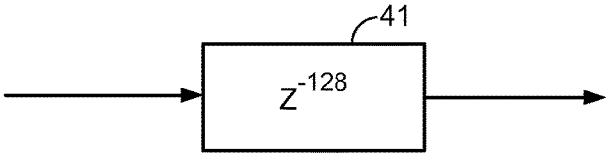
FIG. 4 is a block diagram showing one of the memory based delay circuits of FIG. 3.

This disclosure provides an alternative delay structure by utilizing an adjustable group delay feature of a down sample unit and up sample unit pair. As one example, this disclosure provides for the replacement of one or more memory based delay circuits like circuit 41 of FIG. 4 with a down sample unit and an up sample unit pair. The down sample unit and up sample unit pair may have inherent delay associated with the unit pair, but the memory used in the down sample unit and the up sample unit may comprise a fraction of the memory that would otherwise be needed if memory-based delay circuits were used. The amount of delay provided by the down sample unit and the up sample unit pair may be tunable by selecting parameters of the units, as explained in greater detail below.

Figure 5:
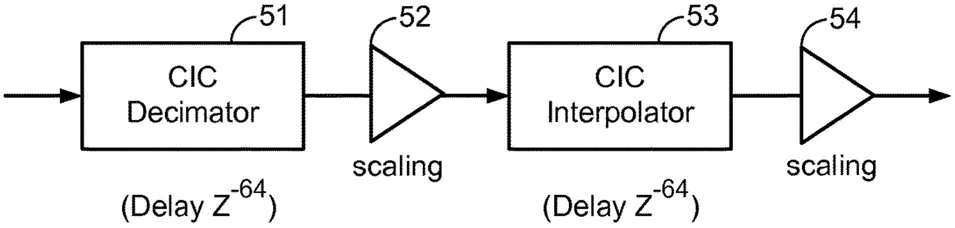
FIG. 5 is a block diagram illustrating an alternative to memory based delay circuits consistent with this disclosure.

The down sample unit and the up sample unit pair may comprise a cascaded integration combiner (CIC) decimator and a CIC interpolator, although this disclosure also contemplates other types of down sample unit and up sample unit pairs. As shown in FIG. 5, for example, a CIC decimator 51 followed by a CIC interpolator 53 may be tuned to provide an equivalent amount of delay to memory based delay circuit 41 of FIG. 4. This amount of delay may be specifically selected to promote anti-noise generation. In the example of FIG. 5, CIC decimator 51 and CIC interpolator 53 each provide one-half of the desired delay although CIC decimator 51 and CIC interpolator 53 could be tuned to provide different amounts of delay. Importantly, the amount of delay associated with the circuit in FIG. 5 may be substantially equivalent to the delay of memory based delay circuit 41 of FIG. 4. Scaling amplifiers 52 and 54 may also be included to avoid truncation-related audio defects. The circuit elements shown in FIG. 5 may define a more efficient way to achieve signal delays in an active noise cancellation circuit relative to memory based delay circuit 41 of FIG. 4.

The CIC decimator/interpolator pair represented in FIG. 5 may be viewed as a low pass filter with variable delay. CIC decimator 51 may comprise a low pass filter and down sampler with a delay determined by the parameters of the low pass filter and down sampler. CIC interpolator 53 may comprise a low pass filter and up sampler with a delay determined by the parameters of the low pass filter and up sampler. By choosing CIC parameters, one can achieve half of a desired delay by CIC decimator 51 and the other half of the desired delay by CIC interpolator 53. Also, by choosing a same down sampling and up sampling ratio for CIC decimator 51 and CIC interpolator 53, the circuit may define the same input and output sampling frequency while achieving low pass filtering and the desired delay effect.

Due to the bit growth characteristics of the CIC circuit, proper scaling may also be needed to achieve the unit gain. Scaling amplifiers 52 and 54 may be used for this purpose. The low pass frequency response of a CIC circuit may also help stabilize active noise cancellation by suppressing high frequency quantization noise. The draw backs of using a CIC circuit may include small aliasing effects of CIC decimator 51 and/or CIC interpolator 53 and possibly in-band signal drop. However, by selecting CIC parameters that minimize the aliasing effect and in-band signal drop, the aliasing effect and in-band signal drop can become negligible. Different CIC parameters are discussed below.

Figure 6:
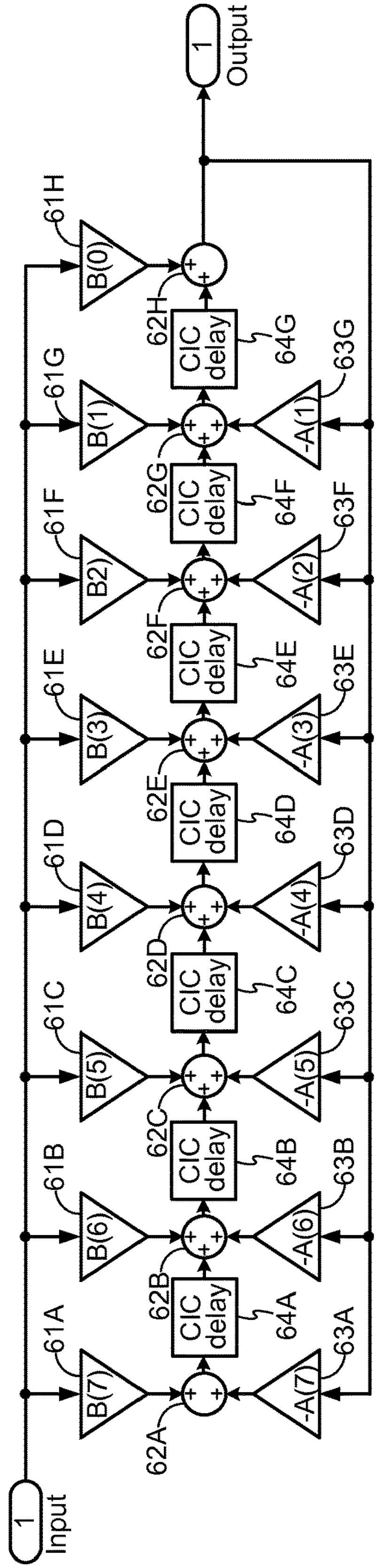
FIG. 6 is circuit diagram of an active noise cancellation circuit that uses down sample and up sample units to replace conventional memory based delay elements.

FIG. 6 is a circuit diagram consistent with this disclosure. In this case, CIC delay circuits 64A-64G replace convention memory circuits to provide the desired delay. Each of CIC delay circuits 64A-64G may comprise a down sample unit and an up sample unit, wherein the down sample unit and the up sample unit are each tuned such that a combined delay associated with processing a sample via the down sample unit and the up sample unit corresponds to a pre-defined delay that is selected to promote active noise cancellation. CIC delay circuits 64A-64G may comprise less hardware and improved stability relative to memory based delay circuits. In the circuit of FIG. 6, as well as the other circuits described herein, the input samples may represent audio samples associated with background noise, and the output samples may comprise audio samples that represent anti-noise that will substantially destructively interfere with the background noise.

The circuit of FIG. 6 includes a first set of amplifiers 61A-61H that receive the input samples, and a second set of amplifiers 63A-63G that receive the output of the circuit as feedback. Adders 62A-62H combine the filtered samples, as shown in FIG. 3 and CIC delay circuits 64A-64G provide the delay needed between filter stages to achieve active noise cancellation.

Again, this disclosure proposes to use of a CIC decimator/interpolator pair as a variable delay which generates delay in proportion to down sampling factor R. In this case, one can increase delay by increasing the down sampling factor R according to decimation factor (K) growth. Overall, the CIC based delay may reduce hardware area relative to convention memory-based delay circuits when implemented in digital application specific integrated circuit (ASIC). Also, a CIC decimator/interpolator pair may achieve a side effect of low pass filtering which can enhance stability of infinite impulse response (IIR) filtering.

A down sample unit and up sample unit pair (e.g., the CIC decimator/interpolator pair) may be arranged in series. In the circuit of FIG. 6, each of CIC delay circuits 64A-64G may comprise a CIC decimator/interpolator pair arranged in series. In other cases described in greater detail below, the down sample unit and up sample unit pair may be arranged in series, but may also include other components between the down sample unit and the up sample unit.

As shown in FIG. 5, a CIC filter may comprise a CIC decimator 51 (which is one example of a down sampler) and a CIC interpolator (which is one example of an up sampler). Cascaded integrators and combiners may be used to form CIC decimator 51 and CIC interpolator 53.

Figure 7:
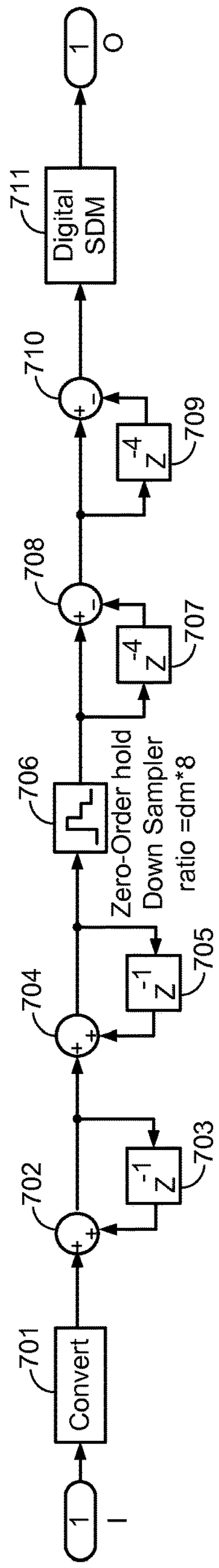
FIG. 7 is a block diagram of an exemplary cascaded integration combiner (CIC) decimator.

FIG. 7 illustrates one example of a CIC decimator, such as CIC decimator 51 of FIG. 5. The CIC decimator shown in FIG. 7 may comprise a convert unit 701 that converts incoming samples to a particular bit depth, such as 21 bits. Adder 702 and delay element 703 form a first integrator, and adder 704 and delay element 705 form a second integrator. Thus, elements 702, 703, 704 and 705 form a two stage integrator. Zero order hold element 706 comprises a down sampler that reduces the data rate, e.g., by a factor of 32, 64, 128 or 256. The down sample ratio may correspond to R=dm*8. In this case, dm is ratio of over sampling frequency (OSF) to 512 KHz, since 512 KHz is the greatest common denominator (GCF) of all over sampling frequencies. The variable "dm" is typically a natural number. R represents the over sampling frequency (such as 64 KHz). By defining dm as above, one can make sure that the down sampled domain is mapped to 64 KHz independent of the input over sampling frequency. The data rate output of zero order hold element 706 may be 64 kilohertz, although other data rates could be used. The delay elements (such as 705 and 707) may be relatively small and memory based delay circuits can be used without much complexity. In FIG. 7 (also in FIG. 9), the variable dm is the same as dm mentioned above, i.e., the over sampling frequency.

Figure 8:
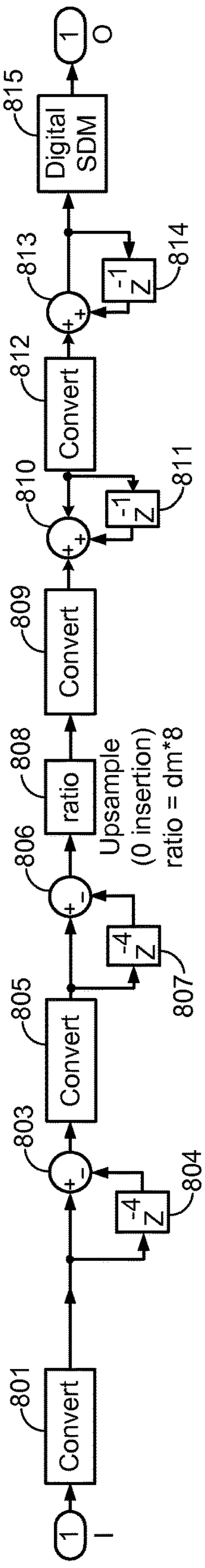
FIG. 8 is a block diagram of an exemplary CIC interpolator.

Delay element 707 and adder 708 form a first combiner, and delay element 709 and adder 710 form a second combiner. Thus, elements 707, 708, 709 and 710 form a two stage combiner. Element 711 comprises a sigma-delta modulator. Additional details of a sigma delta modulator are discussed below with respect to FIG. 9. In FIG. 7, elements 701, 702, 703, 704 and 705 may operate at an up sampled frequency, while elements 707, 708, 709, and 710 may operate at a down sampled frequency, wherein the up sampled frequency is larger than the down sampled frequency by a factor. For example, the up sampled frequency may be larger than the down sampled frequency by a factor of 8, 16, 32, 64, 128, 256, or other multiples of $2^n$ where n is a positive integer FIG. 8 illustrates one example of a CIC interpolator, such as CIC interpolator 53 of FIG. 5. The CIC interpolator shown in FIG. 8 may comprise a convert unit 801 that converts incoming samples to a particular bit depth, such as 24 bits from 23 bit. This bit depth expansion could vary and may be a fairly standard part of CIC interpolator design. Delay element 804 and adder 803 form a first combiner. Convert unit 805 converts the input data bitwidth for adder 806. The CIC interpolator shown in FIG. 8 internally expands the bit width of the data stream stages, and this procedure is performed to expand the bit width of the data line when CIC interpolator is used. Delay element 807 and adder 806 form a second combiner. Thus, elements 803, 804, 805, 806 and 807 form a two stage combiner.

Element 808 comprises an up sampler that up samples the data rate by a factor, e.g., by a factor of 32. Convert unit 809 converts the input data bitwidth for adder 810. Adder 810 and delay element 811 form a first integrator, and adder 813 and delay element 814 form a second integrator. Convert unit 812 is located between the first and second integrators to adjust the output of the first integrator for adder 813. Thus, elements 810, 811, 812, 813 and 814 form a two stage integrator. Element 815 comprise a sigma-delta modulator. Additional details of a sigma delta modulator are discussed below with respect to FIG. 9. In FIG. 8, elements 801, 802, 803, 804, 805 and 806 may operate at a down sampled frequency, while elements 809, 810, 811, 812, 813, 814 and 815 may operate at an up sampled frequency, wherein the up sampled frequency is larger than the down sampled frequency by a factor. For example, the up sampled frequency may be larger than the down sampled frequency by a factor of 8, 16, 32, 64, 128, 256, or other multiples of $2^n$ where n is a positive integer.

More generally, CIC integrator 53 may comprise N digital integrator stages operating at the high over sampling frequency (OSF) rate, where N is an integer. Each stage may be implemented as a one-pole filter with a unity feedback coefficient. The comb section (e.g., sections 803 to 806) of the circuit shown in FIG. 8 operates at the low sampling rate OSF/R (64 KHz) where R is the integer rate change factor. The comb section is the stage of CIC interpolator or decimators that calculates difference between input and delayed input (e.g., elements 803 to 806. This comb section may comprise N comb stages with a differential delay of M samples per stage. In active noise cancellation implementations, the differential delay may be to M=4, and the number of stages may be set to N=2.

The equivalent transfer function of the CIC delay circuit described herein (e.g., a CIC decimator and CIC interpolator pair) referenced to the OSF sampling rate may be given by:

$$H(Z) = H_I(Z)H_C(Z) = \frac{(1 - Z^{-RM})^N}{(1 - Z^{-1})^N} = \left(\sum_{k=0}^{RM-1} Z^{-k}\right)^N$$

wherein H(Z) is the transfer function of CIC delay circuit, $H_1(Z)$ is the transfer function of interpolator section of the CIC delay circuit, $H_c(Z)$ is the transfer function of comb section of the CIC delay circuit, Z is a z-transform variable, R is down sampling or upsampling ratio of CIC delay circuit, M is differential delay number of comb section in CIC delay circuit, and N is number of integer delay circuit stages/differentiation stages of CIC delay circuit.

The frequency response of the CIC circuit may be functionally equivalent to a cascade of N stage finite impulse response (FIR) filters which exhibit constant group delay.

The parameters of a CIC circuit may be tuned to control the delay. An IIR filter tap delay comes from the sum of the CIC filter decimator and interpolator pair. The delay from CIC decimator and interpolator may be respectively given by:

$$\text{Delay}=MRN/2, \text{ where } R=8*dm,\ dm=Fs*\text{OSF}/(8*64000)$$

where N is the number of integration stages, R is the down sampling ration and M is the differential delay, and Fs is the baseband sampling frequency.

Thus, the delay of a CIC pair may be given by:

$$\text{Delay of CIC pair}=MRN$$

Thus, the delay of the CIC circuit may be tuned by controlling three parameters: number of integration stages N, down sampling ratio R and differential delay M. The differential delay M may control spectral null locations of the CIC circuit. Spectral null locations are the frequencies where the filter gain approaches zero.

Accordingly, the total delay of a CIC decimator/interpolator pair is function of M, R, and N. For hardware design, it may be easiest to use a fixed number for M and N while making R variable. In this case, by controlling the down/up sampling ratio R for both CIC decimator and interpolator, the delay of the CIC pair can be properly tuned to the desirable delay. Especially when used with a decimated FIR/IIR filter, a CIC pair may be useful to support multiple sampling rates. When the over-sampling rate changes, the delay may be increased or decreased such that the CIC circuit delay is equivalent to that of a constant base-band filter structure.

The CIC circuits may need units to provide bit width scaling as bit widths grow. Many CIC filters exhibit DC gains. Accordingly, scaling factors may be applied at the output of decimator and interpolator to achieve the overall unit gain of the CIC circuit. In this case, for the decimator:

$$G=(RM)^2=(8*dm*M)^2=dm^2*2^{10},\ B_{max}=B_{in}+N(\log_2 RM)-1$$

Thus, in this case, the bit width of decimator is:

$$3+2(\log_2 192*4)-1)=21$$

In this case, for the interpolator:

$$G_j = \begin{cases} 2^j, & j = 1, 2, \ldots N \\ \dfrac{2^{2N-j}(RM)^{j-N}}{R}, & j = N+1, \ldots 2N \end{cases}$$

$$B_j=B_{in}+\log_2 G_j.\ B_1=24,\ B_2=25,\ B_3=26,\ B_4=37.$$

The gain at the last stage may be:

$$G=RM^2=(8*dm)*M^2=dm*2^7.$$

Active noise cancellation decimator output bits, e.g., the output of a CIC decimator, can be truncated to save hardware area while maintaining the overall noise level. The CIC decimator output may be scaled down by the following $$(dm)^2/\text{cic}_{scale}$$

Similarly, the CIC interpolator output is scaled down by $dm*\text{cic}_{scale}*2^{17}$, where $\text{cic}_{scale}$ is a function of $dm$ as follows:

$$CIC_{scale} = \begin{cases} 1, & \text{if dm} = 1 \\ 3, & \text{if dm} = 3 \\ 4, & \text{otherwise} \end{cases}$$

This scaling may be performed by scaling amplifiers 52 and 54 shown in FIG. 5, but may be implemented as digital sigma-delta modulators of the CIC decimator and CIC interpolator as shown by elements 711 and 815 of FIGS. 7 and 8 respectively.

Figure 9A:
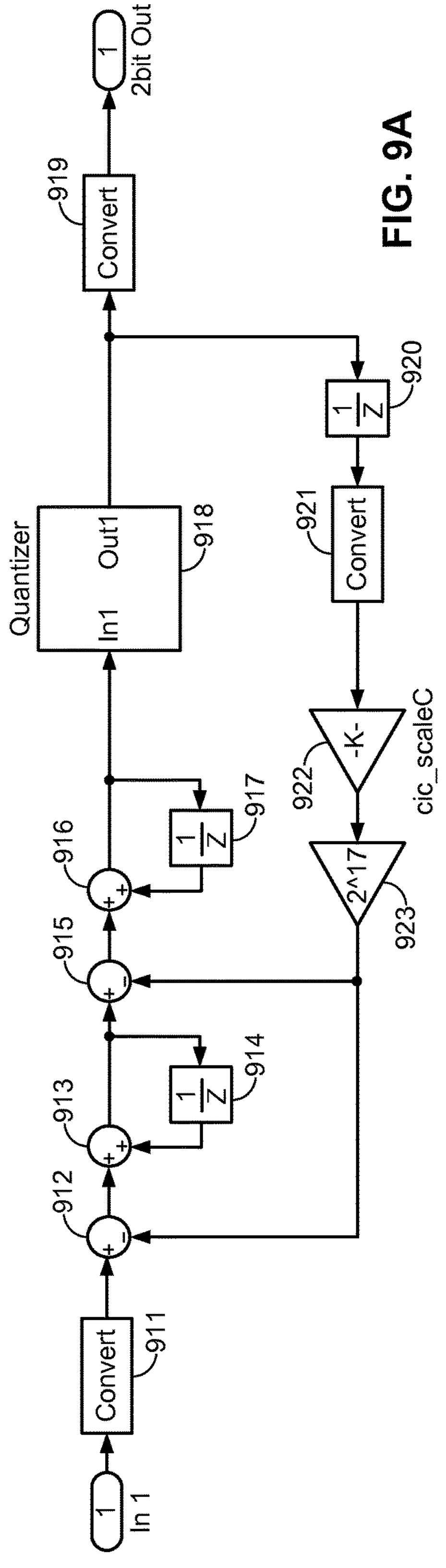
FIG. 9A s a block diagram of an exemplary second order sigma-delta modulator.
Figure 9B:
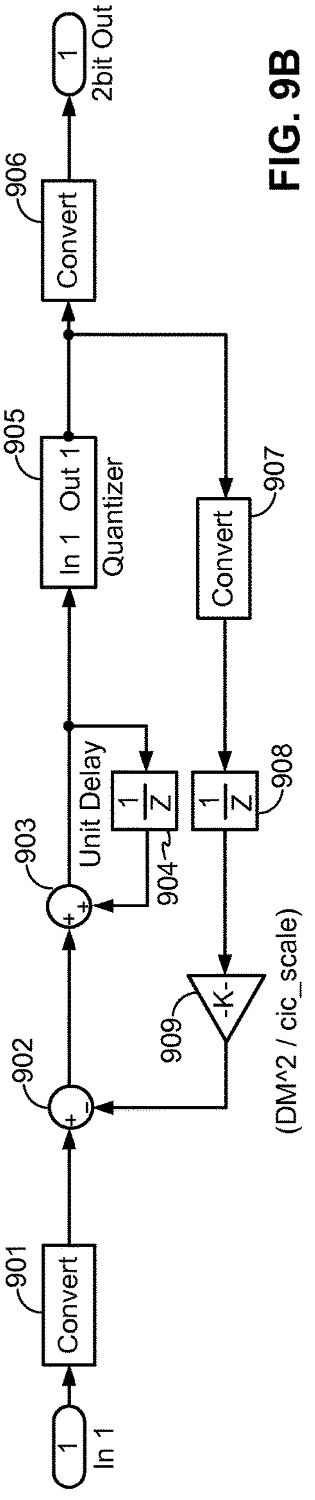
FIG. 9B is a block diagram of an exemplary first order sigma-delta modulator.

FIG. 9A and FIG. 9B are block diagrams of first and second order sigma delta modulators that may be is used for scaling to avoid truncation related audio defects in the context of CIC interpolation and CIC decimation. The block diagrams of FIGS. 9A and 9B may correspond to scaling amplifiers 52 and 54 of FIG. 5, or may form part of CIC decimator and CIC interpolator as shown by elements 711 and 815 of FIGS. 7 and 8 respectively.

FIG. 9B illustrates a first order sigma delta modulator. As shown in FIG. 9B, the first order sigma delta modulator may comprise a convert unit 901 that converts input samples to wider bit depths for adder 902. Adder 902 combines the samples by subtracting input samples from feedback samples of the feedback loop. Adder 903 and delay element 904 define an integrator, and unit 905 performs right shift and rounding operations to scale the samples. Convert unit 906 converts the bit depth to the desired output bit depth, and convert unit 907, delay element 908 and amplifier 909 define a feedback path to adder 902.

FIG. 9A illustrates a second order sigma delta modulator. As shown in FIG. 9A, a second order sigma delta modulator is similar to first order sigma delta modulator except that it uses two signal integrators. In particular, while the first order sigma delta modulator of FIG. 9B may comprise elements 903 and 904 as shown in FIG. 9A, the second order sigma delta modulator of FIG. 9A comprises two integrators corresponding respectively to elements 913 and 914 and to elements 916 and 917.

Generally, the second order sigma delta modulator shown in FIG. 9A includes convert unit 911 that converts the bit depth to a desired input bit depth, adders 912, 913, 915, and 916, delay elements 914, and 917, quantizer 918 and convert unit 919 that converts the bit depth to the desired output bit depth. In the feedback path, the second order sigma delta modulator shown in FIG. 9A includes delay element 920, convert unit 921, and amplifiers 922 and 923. As mentioned, the second order sigma delta modulator is generally similar to first order sigma delta modulator except that it uses two signal integrators corresponding respectively to elements 913 and 914 and to elements 916 and 917. Also, the second order sigma delta modulator includes two different amplifiers in the feedback path.

The variable dm is the ratio of OSF to 512 kHz mentioned above. The value for dm^2/cic_scale is represented under unit 905 and under amplifier 909 of FIG. 9B. Unit 905 applies gain 1/K to the input signal where K=dm^2/cic_scale. The value of cic_scale is determined by the rules shown in a pseudo code of Table 1 below. The scaling is performed to keep the signal dynamic range within some pre-determined limit. The output of unit 905 is used in the feedback loop, where convert unit 907 converts data bitwidth for adder 902, delay element 908 provides one sample delay, and amplifier 909 applies a gain to the samples according to a gain factor K.

TABLE 1

```
if (dm >= 2)
    if (dm == 3)
        cic_scale = 3;
    else
        cic_scale = 2^2;
    end
else
    cic_scale = 1;
end
```

Thus, this disclosure defines a CIC circuit for filtering and first order sigma delta modulators for scaling in the audio path. CIC circuits can cause aliasing errors around nulls for both the CIC decimator and the CIC interpolator. The power response relative to the down sampled frequency (Fs/R) of the CIC filter may be given by:

$$P(f) = \left[\frac{\sin \pi Mf}{\sin\left(\frac{\pi f}{R}\right)}\right]^{2N} \approx \left[RM\frac{\sin \pi Mf}{\pi Mf}\right]^{2N} \text{ for } 0 \le f < \frac{1}{M}$$

In this case,

Fs is the input sampling frequency of CIC decimator, which is the same as the output sampling frequency of CIC interpolator, R is the down sampling ratio of the CIC decimator, which is the same as the up sampling ratio of CIC interpolator, P(f) is the power spectrum (which may be function of frequency f), M is the differential delay number in CIC comb section, f is the frequency, in down sampled clock domain, N is the number of stages in CIC filter.

The nulls in the spectrum may be controlled by differential delay M. For CIC decimators, regions around every null can be folded back to the pass band. i.e. the signals with frequencies after the pass band can be added back to the signals inside the pass band. For CIC interpolators, imaging may occur around every null. By increasing stage number N, the circuit may reduce the aliasing error at the expense of increasing the pass band drooping and total filter delay. Modified CIC filter structures may be used to shape the circuit response to further reduce the aliasing induced error.

Figure 10:
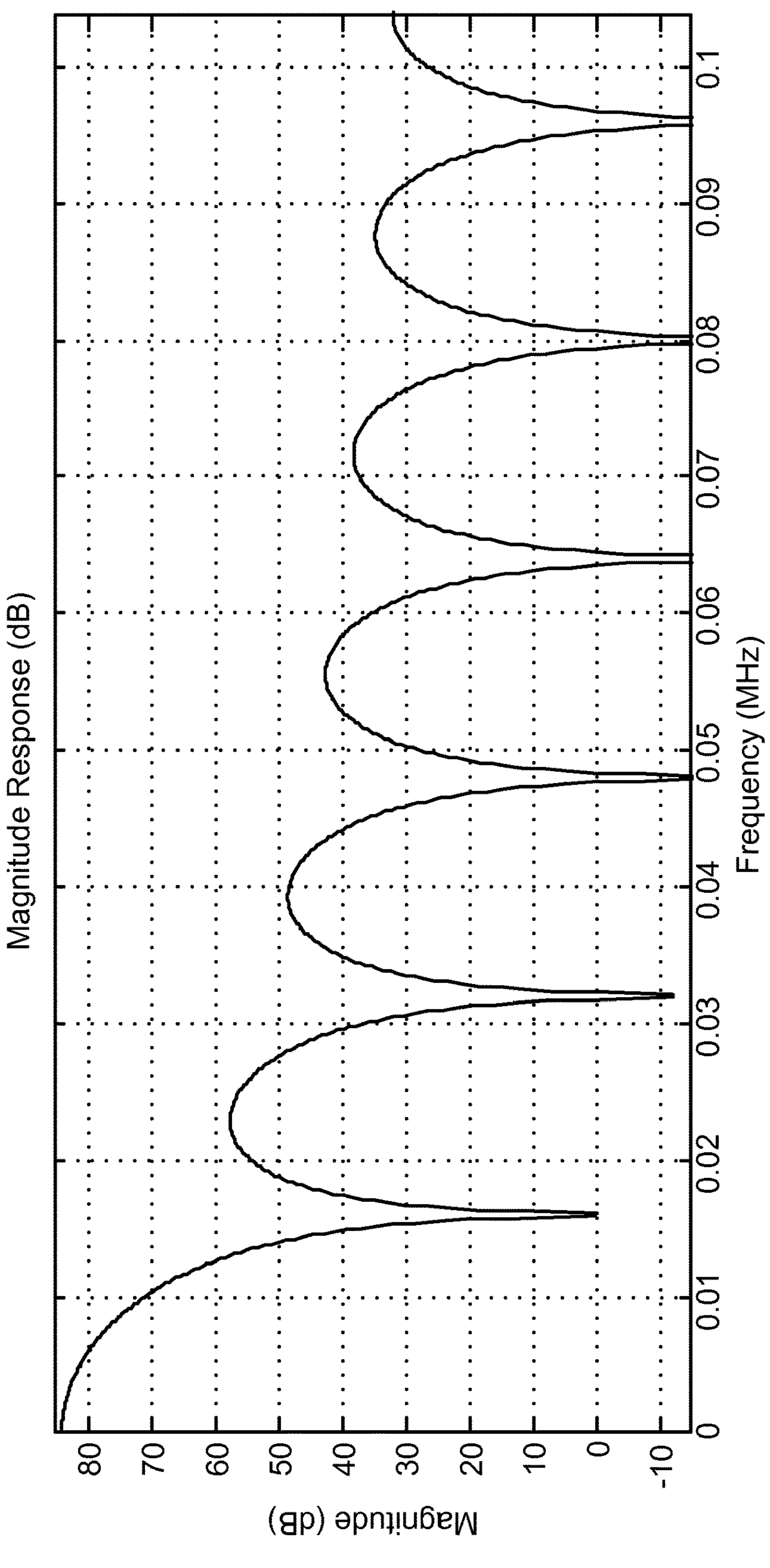
FIG. 10 is a graph illustrating magnitude response of a CIC filter that includes a CIC decimator and a CIC interpolator.

FIG. 10 illustrates an exemplary magnitude response of CIC circuit that includes a CIC decimator and CIC interpolator, as described herein. In this case, the parameters of the CIC circuit may be N=2, M=4, R=32, with down sampling from 2048 KHz to 64 KHz. The N, M and R parameters may be specifically chosen to balance the filter delay, frequency response and aliasing requirements for any given implementation. The frequency response of the CIC circuit shows that it passes signals well below 1 KHz, but suppress down signals in higher frequencies. This property is the key to achieve good enough down sampling.

Again, a first order sigma delta modulator may be used for scaling to avoid truncation related audio defects. The sigma delta modulator may slightly affect audio quality, such as by generating limit cycles, or by exhibiting tonal behaviors with dc or zero inputs. Certain measures can be used to improve the stability of sigma delta modulators, such as using higher order sigma delta modulators, adding dithering or small perturbations to the quantizer or the input, and/or using integrators that exhibit local chaotic behavior.

FIGS. 11-14 are circuit diagrams of an active noise cancellation circuits consistent with various examples of this disclosure. In these cases, the input samples to the circuits may represent audio samples associated with background noise, and the output samples of the circuits may comprise audio samples that represent anti-noise that will substantially destructively interfere with the background noise. For each of the delay elements, inputs “i” and outputs “o” are labeled.

In accordance with this disclosure, signal processing for audio noise cancellation is performed in the digital domain. An analog signal may be transformed from analog into digital format by one or more analog to digital converters (DACs). In this case, the signal magnitude is sampled at a regular rate, which may be referred to as a sampling rate. The signal amplitude may be quantized and stored. This form of audio signal conversion is commonly known as pulse code modulation (PCM). In PCM, a signal is a recorded binary code with a typical resolution of 12 or more bits. On the other hand, a sigma delta modulator may convert analog signals into discrete time signals of low resolution (e.g., 1-4 bits) but with high sampling rate, commonly called over sampling. The over sampling rate (OSR) is usually the sampling rate multiplied by a factor (called over sampling factor or OSF).

Signals in the over sampled format are commonly known as pulse density modulation (PDM) samples. Signal processing in the PCM domain has the advantage of simplicity in implementation. However, the analog to digital conversion step in producing PCM data typically has a processing delay of at least a few samples. This delay may be too long for some time critical applications, such as active noise cancellation. On the other hand, processing signals in the PDM domain offers the advantage of very low processing latency due to its high sampling rate.

Let $x_t$ be the signal in PCM, a filter with coefficients ($B_0$, $B_1$, . . . , $B_n$, $A_0$, $A_1$, . . . , $A_n$) ($A_0$=1) being applied to the signal $x_t$ to give output $y_t$. In this case:

$$y_t=B_0x_t+B_1x_{t-1}+B_2x_{t-2}+ \dots +B_nx_{t-n}-A_1y_{t-1}-A_2y_{t-2}- \dots -A_ny_{t-n}$$

When a z-transform is applied, this equation above can be expressed in the z-domain as $$Y(z)=\frac{B_0+B_1z^{-1}+B_2z^{-2}+\dots+B_nz^{-n}}{1+A_1z^{-1}+A_2z^{-2}+\dots+A_nz^{-n}}X(z)$$

where X(z) and Y(z) are the z-transform of $x_t$ and $y_t$ respectively.

Let $u_t$ and $v_t$ be the input and output signals in PDM domain with an oversampling factor R. If the only operations are modification of frequency under SR/2, filtering can be performed with the same filter coefficients. Therefore, the expression above in the z-domain for PDM samples may be:

$$V(z)=\frac{B_0+B_1z^{-R}+B_2z^{-2R}+\dots+B_nz^{-nR}}{1+A_1z^{-R}+A_2z^{-2R}+\dots+A_nz^{-nR}}U(z)$$

where U(z) and V(z) are the z-transform of $u_t$ and $v_t$ respectively and R represents the oversampling factor. Thus, R represent how many times the signal is oversampled in the PDM domain, as compared to signal in the PCM domain. In ANC, $x_t$ is the PCM domain noise signal measured (input of ANC control), and $y_t$ is anti-noise signal computed by an ANC control circuit. X(z) and Y(z) correspond to the input noise and anti-noise signals in z-transform domain. In PDM domain, the z-transform input and output signal are represented by U(z) and V(z). The modification of input signal to generate the output signal is represented by the quotients involving B's and A's.

Figure 11:
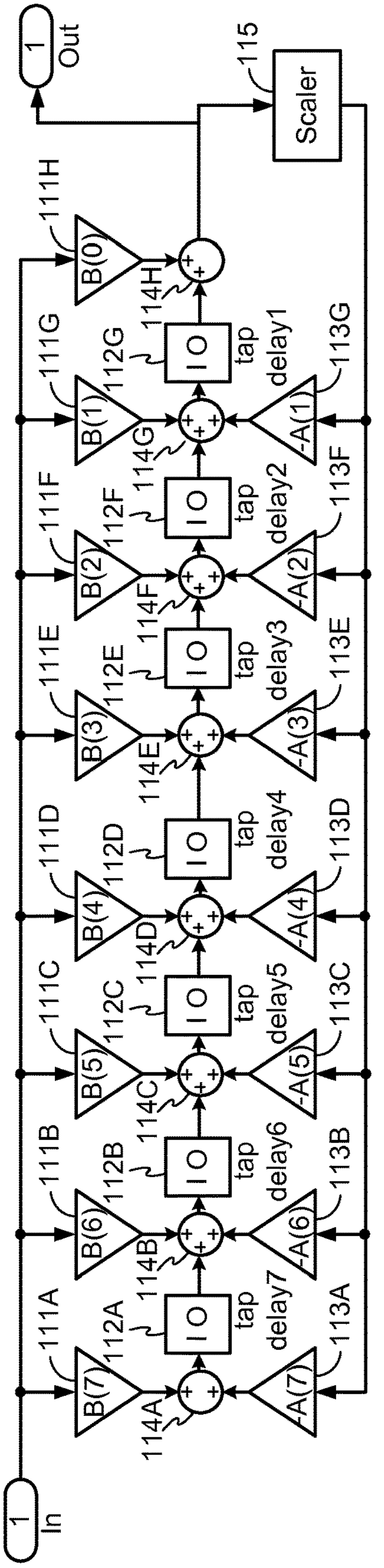
FIG. 11 is circuit diagram of an active noise cancellation circuit that uses conventional memory based delay elements.

FIG. 11 is circuit diagram of an active noise cancellation circuit that uses conventional memory based delay elements in the context of upsampled samples, such as PDM samples. The input samples, in this case PDM samples, are received by amplifiers 111A-111H. The output samples of the circuit are fed back to amplifiers 113A-113G after passing through scaler unit 115, which scales the output samples to the appropriate bit depth. Amplifiers 111-111H and amplifiers 113A-113G may define the application of filter taps to the samples. For example, amplifiers 111A-111H and amplifiers 113A-113G may comprise digital multiplier circuits that multiply the input signal by a gain factor. The gain factors may be selected to achieve the desired signal amplification needed for active noise cancellation.

Adders 114A-114H combine the output of amplifiers 111A-111H with the output of amplifiers 113A-113G and memory based delay circuits 112A-112G as illustrated. Memory based delay circuits 112A-112G provide one sample delays between each successive stage of the circuit, as the samples are processed. Thus, the different stages of the circuit are separated by memory based delay circuits 112A-112G. An input sample is filtered by each filter stage, but as a given sample moves through the stages along memory based delay circuits 112A-112G, the filtering accumulates to provide a desirable anti-noise effect in the output.

Figure 12:
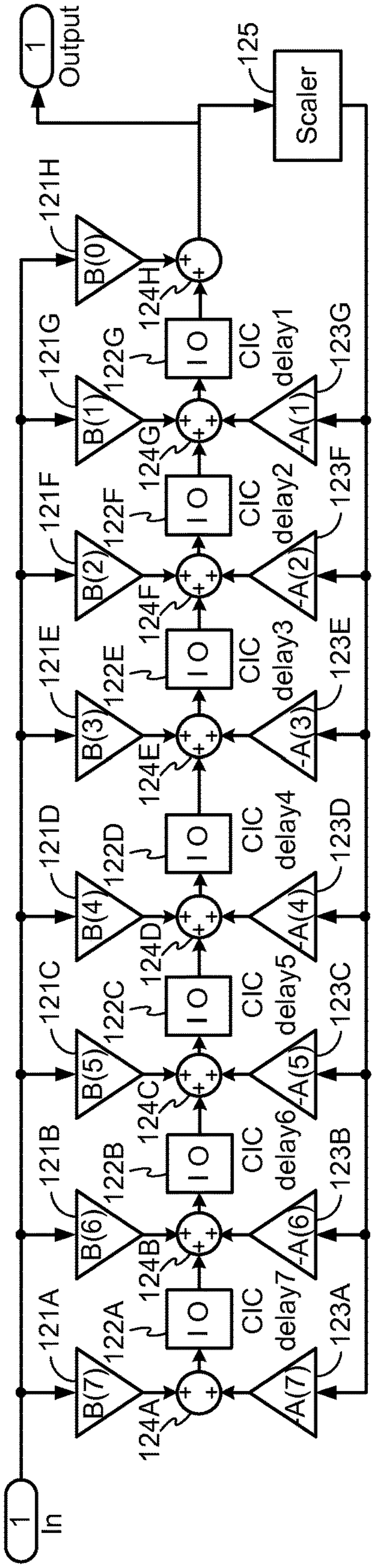
FIG. 12 is a circuit diagram of an active noise cancellation circuit that uses down sample and up sample units to replace conventional memory based delay elements.

As noted herein, such memory based delay circuits 112A-112G may be undesirable from an implementation standpoint. Instead of using tap delay lines to store the intermediate output from each filter tap, an alternative of this disclosure is to use CIC decimator/interpolator pair that has the desired delay collectively. FIG. 12 illustrates this concept relative to FIG. 11.

Specifically, FIG. 12 is circuit diagram of an active noise cancellation circuit that uses CIC delay circuits 122A-122G instead of conventional memory based delay. The input samples, in this case PDM samples, are received by amplifiers 121A-121H. The output samples of the circuit are fed back to amplifiers 123A-123G after passing through scaler unit 125, which scales the output samples to the appropriate bit depth. Amplifiers 121-121H and amplifiers 123A-123G may define the application of filter taps to the samples. For example, amplifiers 121A-121H and amplifiers 123A-123G may comprise digital multiplier circuits that multiply the input signal by a gain factor. The gain factors may be selected to achieve the desired signal amplification needed for active noise cancellation.

Adders 124A-124H combine the output of amplifiers 121A-121H with the output of amplifiers 123A-123G and CIC delay circuits 122A-122G as illustrated. CIC delay circuits 122A-122G provide one sample delays between each successive stage of the circuit, as the samples are processed. Thus, the different stages of the circuit are separated by CIC delay circuits 122A-122G rather than memory based delay circuits. An input sample is filtered by each filter stage, but as a given sample moves through the stages along CIC delay circuits 122A-122G, the filtering accumulates to provide a desirable anti-noise effect in the output.

Figure 13:
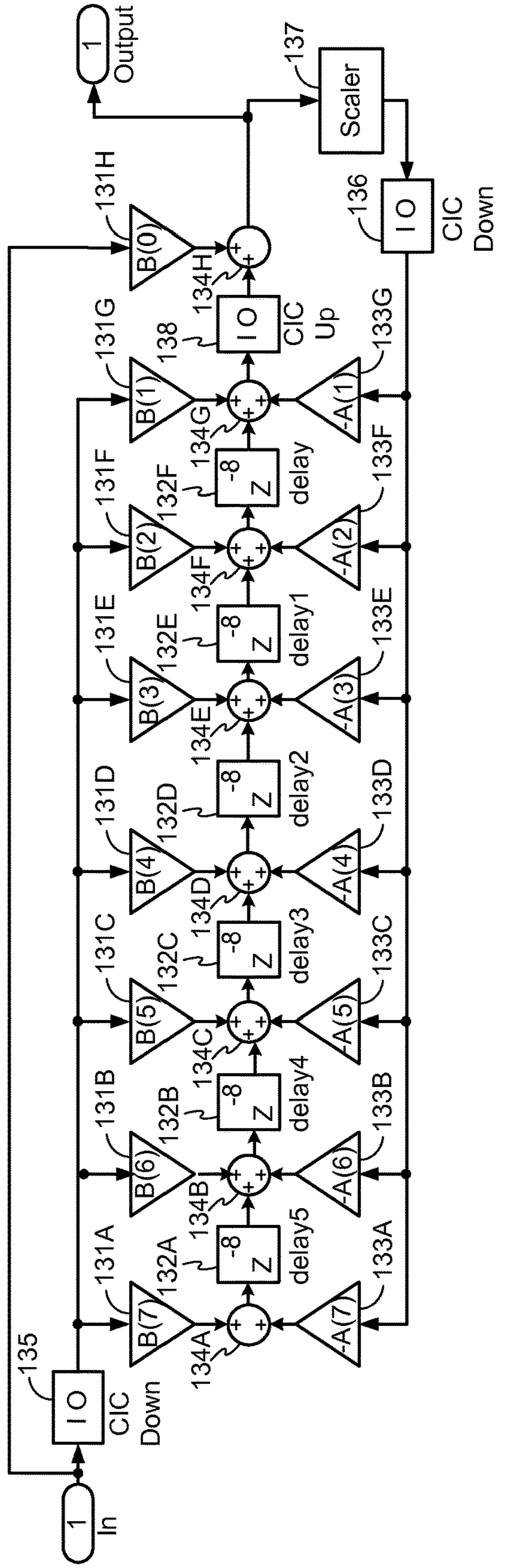
FIG. 13 is a circuit diagram of a hybrid active noise cancellation circuit that performs filtering in two different sample rate domains, and uses down sample and up sample units at least in part to achieve necessary delay.
Figure 14:
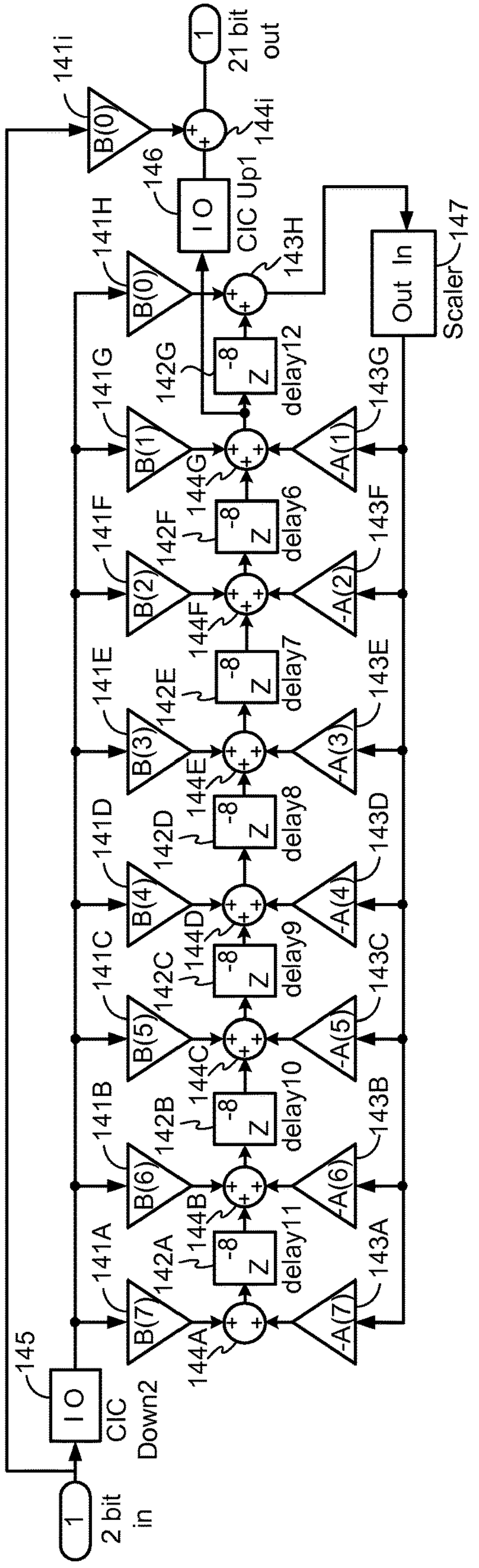
FIG. 14 is another circuit diagram of a hybrid active noise cancellation circuit that performs filtering in two different sample rate domains, and uses down sample and up sample units at least in part to achieve necessary delay.
Figure 15:
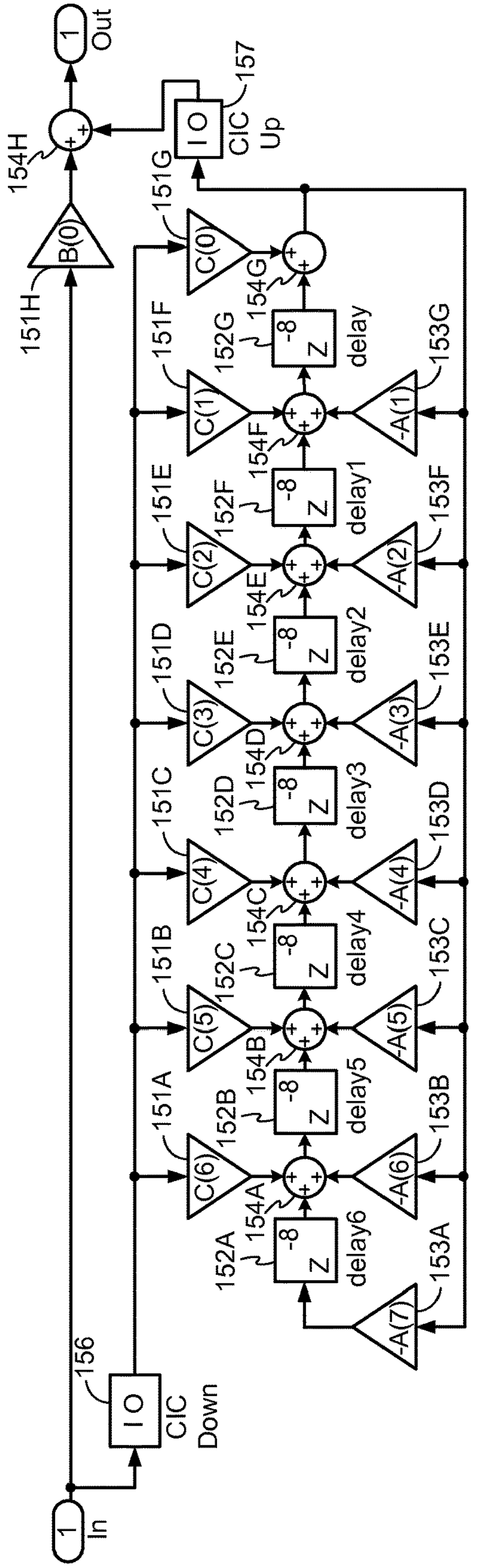
FIG. 15 is another circuit diagram of a hybrid active noise cancellation circuit that performs filtering in two different sample rate domains, and uses down sample and up sample units at least in part to achieve necessary delay.

Again, although filtering in the PDM domain offers the advantage of very low processing latency, one drawback is the large amount of memory elements required to store the over-sampled data in the time delay line. Since the low latency requirement only applies to the $B_1$ coefficient and all other coefficients are associated with some algorithmic delay, other coefficients can be applied to signal at a sampling rate lower than the OSR. This can be achieved by a scheme of hybrid filtering in both PCM and PDM domain, as depicted in FIGS. 13-15. In these schemes, input and output signals are in PDM domain. Coefficient $B_0$ is applied to the PDM input signal. A CIC down sampling filter is applied to both the input and output signals to generate the PCM streams of the samples. Coefficients $B_1$ to $B_7$ are applied to the PCM input signal while coefficients $A_1$ to $A_7$ are applied to the PCM output signal. The final output from these coefficients would then be up sampled through a CIC up sampling filter and added to the PDM stream associated with $B_0$. Typically, due to the limited delay allowed between coefficients $B_0$ and $B_1$ and anti-aliasing requirement from the CIC circuits, the PCM may be an intermediate sampling rate that is larger than the base sampling rate. As with other examples herein, the examples of FIGS. 13-15 show discrete numbers of amplifiers and stages, but the numbers of amplifiers and stages could be different for other examples consistent with this disclosure.

In the example in FIG. 13, the intermediate sampling rate may be eight times of the base sampling rate. Consistent with the delay techniques of this disclosure, in the active noise cancellation circuit of FIG. 13 the CIC down sampling and CIC up sampling filters provide a way to achieve the delay between coefficients $B_0$ and $B_1$. Specifically, CIC down sampler 135 and CIC up sampler 138 form a CIC decimator interpolator pair that provides the delay needed between the application of coefficients $B_0$ and $B_1$. CIC down sampler 136 ensures that the output is down sampled to the proper domain in the feedback loop, and scaler unit 137 scales the samples to ensure the proper bit depth.

FIG. 13 is circuit diagram of a hybrid active noise cancellation circuit that filters samples in the PDM and PCM domains, and also uses a down sampler and up sampler pair for purposes of delay between filter taps. The input samples, in this case PDM samples, are received by the circuit and amplifier 131H filters in the PDM domain. CIC down sampler 135 down samples the input samples to the PCM domain. The samples in the PCM domain are filtered by amplifiers 131A-131G. The output samples of the circuit are fed back to amplifiers 133A-133G after passing through scaler unit 137, which scales the output samples to the appropriate bit depth, and another CIC down sampler 136 that converts from the PDM domain to PCM domain. Amplifiers 131A-131H and amplifiers 133A-133G may define the application of filter taps to the samples. For example, amplifiers 131A-131H and amplifiers 133A-133G may comprise digital multiplier circuits that multiply the input signal by a gain factor. The gain factors may be selected to achieve the desired signal amplification needed for active noise cancellation. Notably, amplifier 131H operates on samples in the PDM domain, while the other amplifiers operate on samples in the PCM domain. Elements 135 and 136 may comprise a CIC decimator and element 138 may comprise a CIC interpolator, and these elements 135, 136 and 138 may be tuned to achieve a desired delay between the application of filter 131H on a sample in the PDM domain and the application of filters amplifiers 131A-131G on that sample in the PCM domain.

Adders 134A-134G combine the output of amplifiers 131A-131G with the output of amplifiers 133A-133G and memory based delay circuits 132A-132G as illustrated. Memory based delay circuits 132A-132G provide eight sample delays between each successive stage of the circuit, as the samples are processed. Once the output of adder 134G is up converted back to the PDM domain via CIC up sampler 138, the output of CIC up sampler 138 is combined with the output of amplifier 131H to produce the circuit output, which may comprise anti-noise.

An alternative scheme of hybrid filtering (e.g., filtering in the PCM and PDM domains) is also possible as depicted in FIG. 14. In this scheme, instead of applying CIC up sampling to the PCM output feedback, B1 is also applied to the PCM stream and combined with the output from coefficients B2 to B8 and A2 to A8. This signal would be the PCM output signal required for the feedback coefficients A2 to A8.

In particular, FIG. 14 is circuit diagram of a hybrid active noise cancellation circuit that filters samples in the PDM and PCM domains, and also uses a down sampler and up sampler pair for purposes of delay between filter taps. The input samples, in this case PDM samples, are received by the circuit and amplifier 141*i* filters in the PDM domain. CIC down sampler 145 down samples the input samples to the PCM domain. The samples in the PCM domain are filtered by amplifiers 141A-141H. The output of adder 143H is fed back to amplifiers 143A-143G after passing through scaler unit 147, which scales the samples to the appropriate bit depth.

Amplifiers 141A-141*i* and amplifiers 143A-143G may define the application of filter taps to the samples. For example, amplifiers 141A-141*i* and amplifiers 143A-143G may comprise digital multiplier circuits that multiply the input signal by a gain factor. The gain factors may be selected to achieve the desired signal amplification needed for active noise cancellation. Notably, amplifier 141*i* operates on samples in the PDM domain, while the other amplifiers operate on samples in the PCM domain. Element 145 may comprise a CIC decimator and element 146 may comprise a CIC interpolator, and these elements 145 and 146 may be tuned to achieve a desired delay between the application of filter 141*i* on a sample in the PDM domain and the application of amplifiers 141A-141G on that sample in the PCM domain.

Adders 144A-144G combine the output of amplifiers 141A-141G with the output of amplifiers 143A-143G and memory based delay circuits 142A-142G as illustrated. Similarly, adder 143H combines the output of delay circuit 142G with the output of amplifier 141H. Memory based delay circuits 142A-142G provide eight sample delays between each successive stage of the circuit, as the samples are processed. Once the output of adder 144G is up converted back to the PDM domain via CIC up sampler 146, the output of CIC up sampler 146 is combined with the output of amplifier 141*i* via adder 144*i* to produce the circuit output, which may comprise anti-noise.

FIG. 15 illustrates yet another circuit configuration. Consistent with the circuit configuration of FIG. 15, the output $y_t$ may be expressed as the sum of two filters.

$$y_t = B_0 x_t + s_t$$

$B_0$ is the amplifier 151H in FIG. 15. The value $x_t$ is the input signal, as explained above. The value $s_t$ is the difference between target signal $y_t$ and $B_0\, x_t$. Thus, $s_t = y_t - B_0 x_t$. Or in Z-domain, $$Y(z) = B_0 X(z) + S(z)$$

Y(z), X(z) have the same meaning as defined above, and represent the z-transform of the output signal $y_t$ and input signal $x_t$. S(z) is the z-transform of the signal $s_t$.

Accordingly, $$Y(z) = B_0 X(z) + S(z)$$

$$\begin{aligned} S(z) &= Y(z) - B_0 X(z) \\ &= \frac{B_0 + B_1 z^{-1} + B_2 z^{-2} + \ldots + B_n z^{-n}}{1 + A_1 z^{-1} + A_2 z^{-2} + \ldots + A_n z^{-n}} X(z) - B_0 X(z) \\ &= \frac{(B_1 - B_0 A_1) + (B_2 - B_0 A_2) z^{-1} + \ldots + (B_n - B_0 A_n) z^{-(n-1)}}{1 + A_1 z^{-1} + A_2 z^{-2} + \ldots + A_n z^{-n}} \\ &\quad z^{-1} X(z) \\ &= \frac{C_0 + C_1 z^{-1} + \ldots + C_{n-1} z^{-(n-1)}}{1 + A_1 z^{-1} + A_2 z^{-2} + \ldots + A_n z^{-n}} z^{-1} X(z) \end{aligned}$$

Here Y(z), X(z), $B_0$, $B_1$, $B_2$, $A_0$, $A_1$, $A_2$, have the same meanings defined above. The newly introduced variables is defined as:

$$C_0=B_1-B_0A_1$$

$$C_1=(B_2-B_0A_2)$$

$$C_2=(B_3-B_0A_3).$$

An implementation of this scheme is depicted in FIG. 15.

In the circuit of FIG. 15, filtering through coefficients C0 to C6 and A1 to A7 is done entirely in the PCM domain. This gives freedom in the form in which this filter is implemented, which may allow a high-order recursive filter to be broken into cascade biquad filters, summation of parallel filters, or the like. The cascade biquad implementation may be desirable because this type of filter is stable even with quantized coefficients.

The expansion of $Y(z)=B_0X(z)+S(z)$ can be repeated for S(z) as $$S(z)=z^{-1}(C_0X(z)+S_1(z))$$

This is useful in a couple of reasons. First, the signal can be further down sampled from an intermediate sampling rate to a base sampling rate and memory saving can be achieved via this down sampling. Second, the input signal can be down sampled to multiple intermediate sampling rates, each time by a small factor, until the sampling rate is reached. By down sampling with a smaller factor, good anti-aliasing properties may be ensured. In addition, filtering signals with B0 at the over sampling rate (e.g., in the PDM domain) may ensure minimal processing latency. Filtering a signal with C0 at an intermediate sampling rate that is ¼ of the over sampling rate ensures that processing latency associated with coefficient B1 can still be exploited. The processing latencies associated with B2 and B3 may also be exploited and met when filtering at ISR2=ISR/4 and ISR3=ISR2/4, where ISR stands for intermediate sampling rate. Finally, by repeated expansions, an infinite impulse response (IIR) filter is effectively converted into a finite impulse response (FIR) filter, which may offer better stability.

In particular, FIG. 15 is circuit diagram of a hybrid active noise cancellation circuit that filters samples in the PDM and PCM domains, and also uses a down sampler and an up sampler unit pair for purposes of delay between filter taps. The input samples, in this case PDM samples, are received by the circuit and amplifier 151H filters in the PDM domain. CIC down sampler 156 down samples the input samples to the PCM domain. The samples in the PCM domain are filtered by amplifiers 151A-151G. The output of adder 154G is fed back to amplifiers 153A-153G. Amplifiers 151A-151H and amplifiers 153A-153G may define the application of filter taps to the samples. For example, amplifiers 151A-151H and amplifiers 153A-153G may comprise digital multiplier circuits that multiply the input signal by a gain factor. The gain factors may be selected to achieve the desired signal amplification needed for active noise cancellation. Notably, amplifier 151H operates on samples in the PDM domain, while the other amplifiers operate on samples in the PCM domain. Element 156 may comprise a CIC decimator and element 157 may comprise a CIC interpolator, and these elements 156 and 157 may be tuned to achieve a desired delay between the application of amplifier 151H on a sample in the PDM domain and the application of amplifiers 151A-151G on that sample in the PCM domain.

Adders 154A-154F combine the output of amplifiers 151A-151F with the output of amplifiers 153A-153G and memory based delay circuits 152A-152G as illustrated. Similarly, adder 154G combines the output of delay circuit 152G with the output of amplifier 151G. Memory based delay circuits 152A-152G provide eight sample delays between each successive stage of the circuit, as the samples are processed. Once the output of adder 154G is up converted back to the PDM domain via CIC up sampler 157, the output of CIC up sampler 157 is combined with the output of amplifier 151H to produce the circuit output, which may comprise anti-noise.

In general, the CIC downsampler may be replaced with a generic FIR filter and a generic downsampler. Moreover, the CIC upsampler may be replaced with a generic upsampler and a generic FIR filter.

Figure 16:
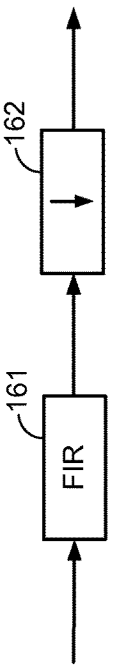
FIG. 16 is a block diagram showing an alternative to CIC decimators consistent with this disclosure.

In other examples consistent with this disclosure, the CIC decimator described herein may be combined with additional filters, or may be replaced with other types of down sample units to achieve a portion of the desired delay. One such down sample configuration is shown in FIG. 16, which comprises an FIR filter 161 and a down sampler 162. In this case, the FIR filter 161 may perform lowpass filtering to prevent aliasing of the out of band high frequency signal into the output during down sampling. Down sampler 162 may reduce the sampling rate of the digital signal by removing R−1 samples from every R samples of input signal.

Figure 17:
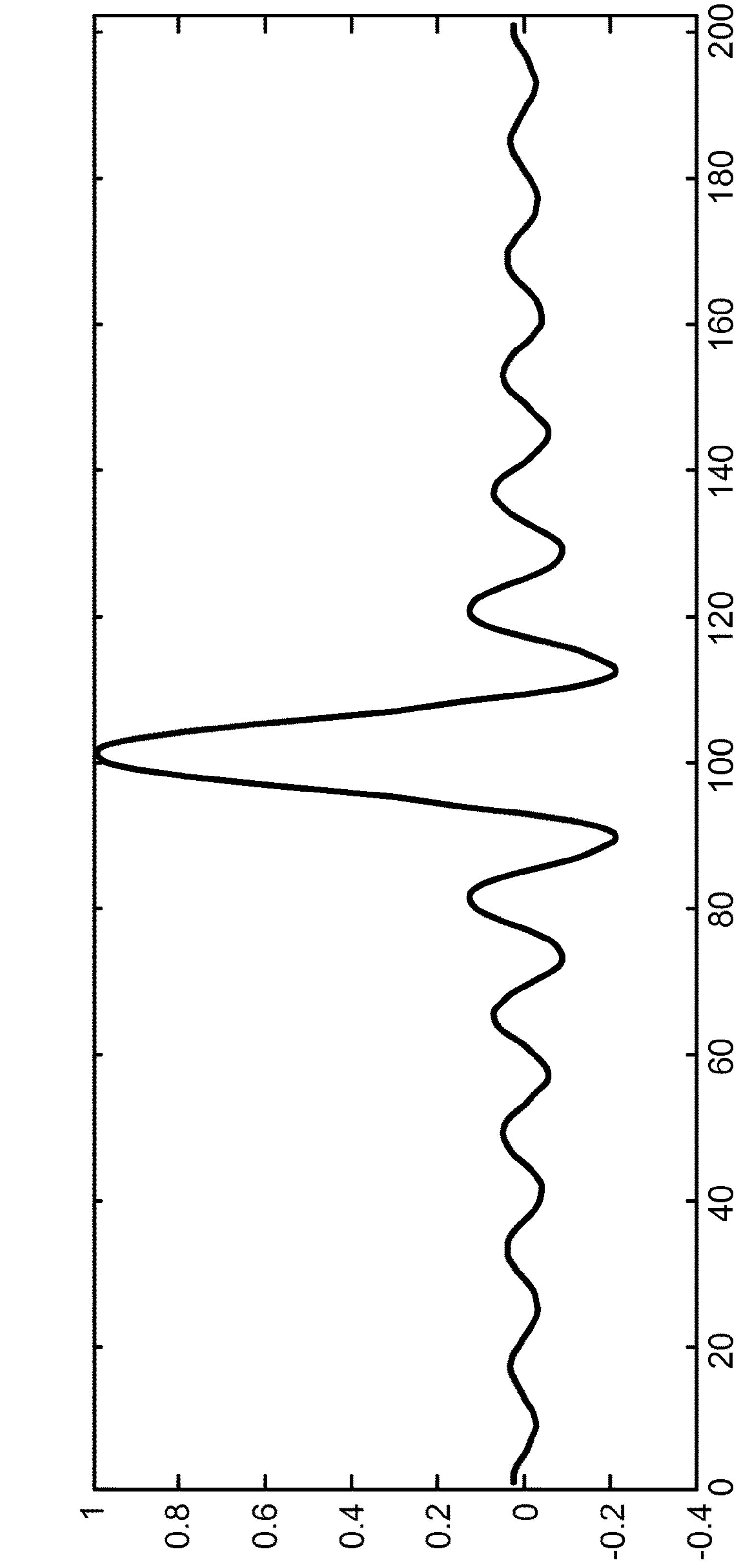
FIGS. 17, 18A and 18B are graphs demonstrating operation of an FIR filter of the circuit shown in FIG. 16 consistent with this disclosure.
Figure 18A:
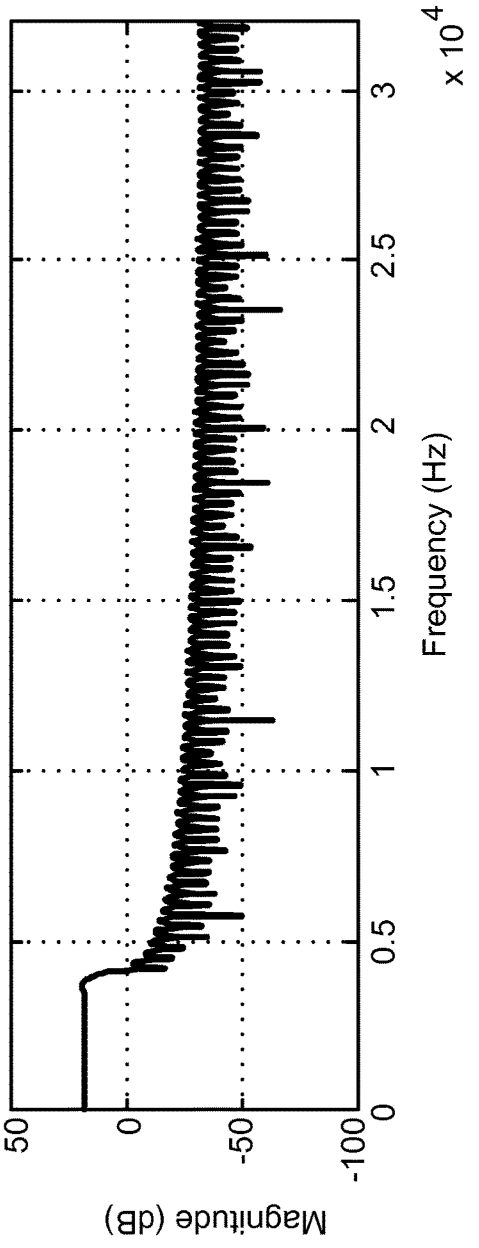
Figure 18B:
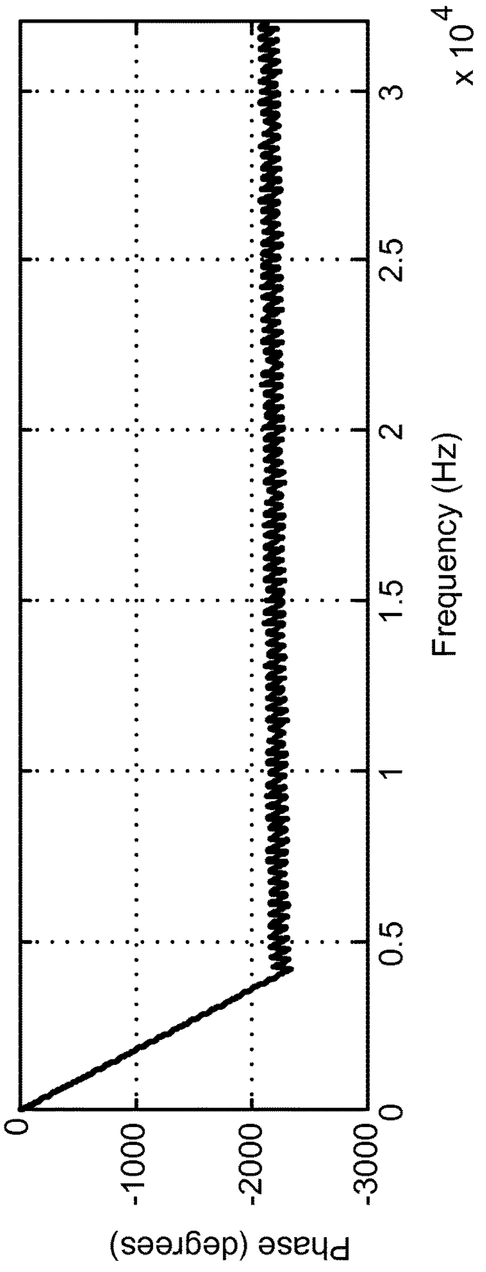

FIR filter 161 may be symmetric such that FIR filter 161 provides a constant group delay for all frequencies. The length FIR filter 161 may be set to provide desired delay. Usually, if a delay of N taps is required, the length of the filter would be 2N−1 taps. One example of a feasible FIR filter response is shown by the graphs of FIGS. 17, 18A and 18B. FIG. 17 is a graph showing one example of FIR filter used in the FIR+down sampler combination in FIG. 16. Here, the x-axis is the filter tap index and y-axis represents the filter tap coefficients.

FIGS. 18A and 18B are two graphs illustrating output magnitude and output phase, respectively, as a function of input frequency. FIGS. 18A and 18B show an exemplary response of the FIR filter used in one example of downsampling the signal from 64 kHz to 8 kHz sampling rate. FIG. 18A is the amplitude respond in dB and FIG. 18B is the phase respond in degree, as a function of input signal frequency. To successfully downsample the signal, the FIR filter should preserve signal within band after downsampling. This is 8 kHz/2=4 kHz in current example, and the amplitude response plot shows that the FIR filter does maintain a constant signal level from 0 Hz to 4 kHz. Also, the FIR should suppress out of band signal (i.e., signal>4 kHz) to prevent aliasing. The plot shows that the FIR filter can suppress this base band signal signal>4 kHz down by roughly 40 dB. Also, to prevent phase distortion to in band signal, the FIR should have a linear phase, as shown in FIG. 18B such that the phase is a straight line going negative as frequency increases. FIR filter 161 may be designed to achieve such filtering. The FIR filter output demonstrated by the graphs of FIGS. 17, 18A and 18B may allow for down sampling from 64 kHz to 8 kHz with roughly 50 dB suppression of alias signal.

Figure 19:
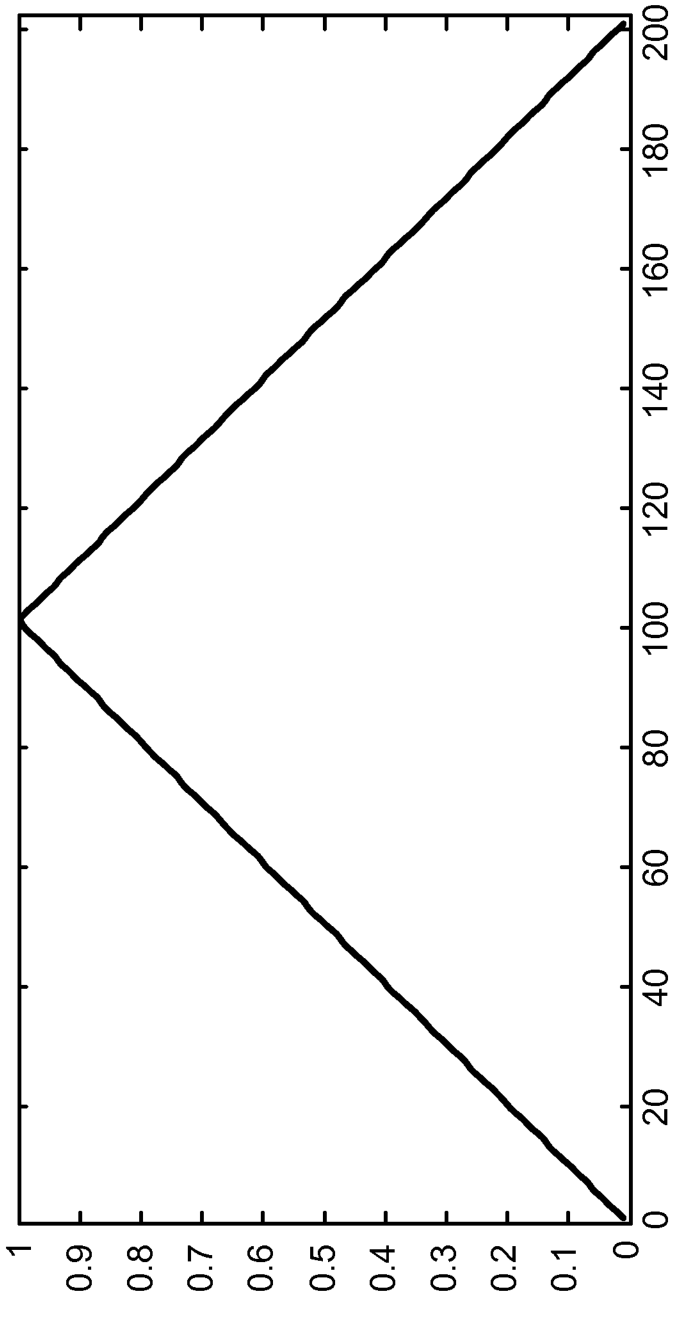
FIGS. 19 and 20A and 20B are graphs demonstrating operation of another exemplary FIR filter of the circuit shown in FIG. 16 consistent with this disclosure.
Figure 20A:
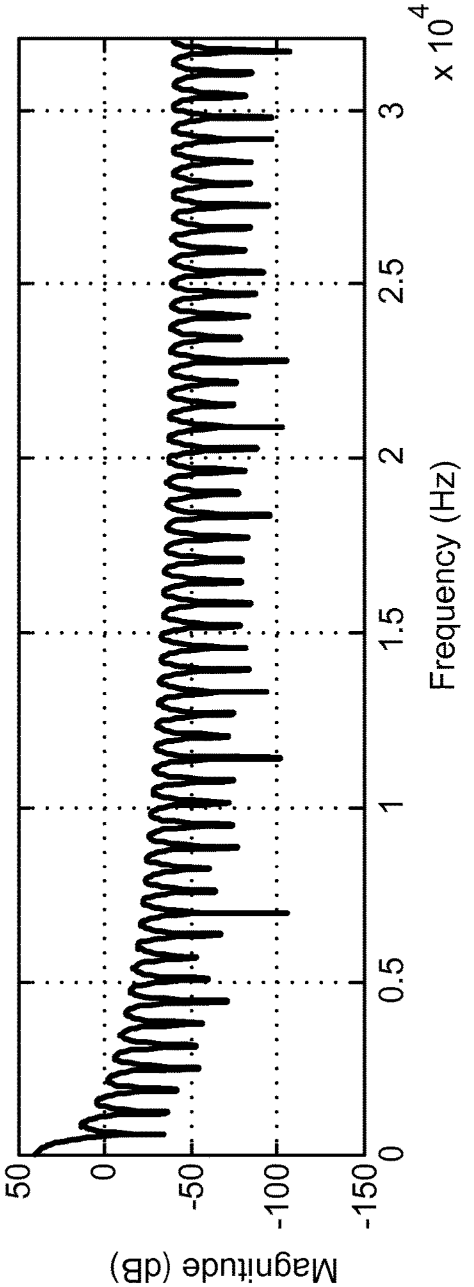
Figure 20B:
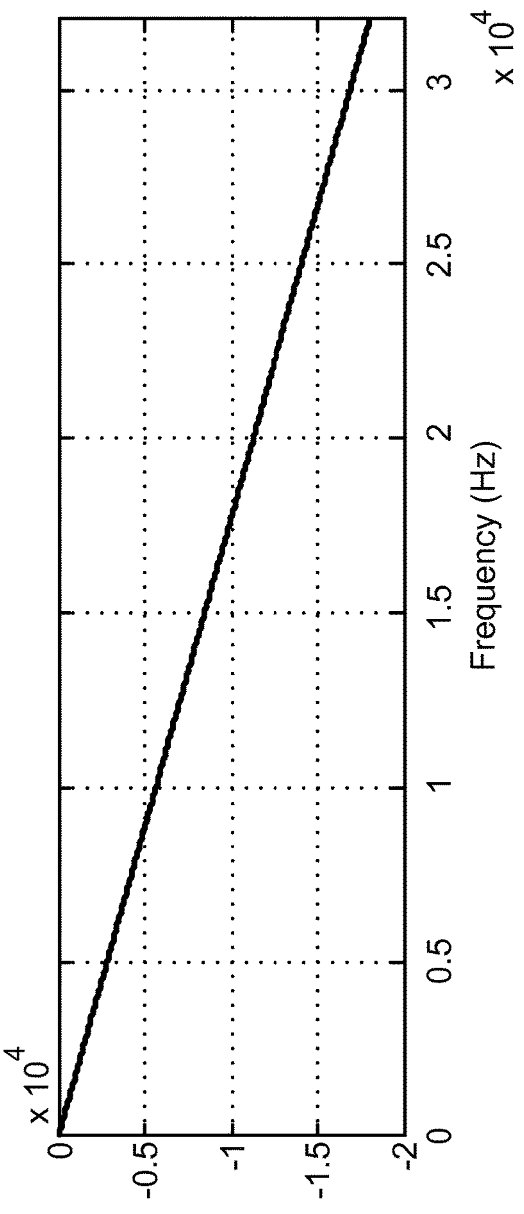

FIGS. 19, 20A and 20B illustrate an example of another feasible FIR filter that may be used for FIR filter 161 consistent with this disclosure. FIG. 19 is another graph showing an FIR filter response, and FIGS. 20A and 20B are two graphs illustrating output magnitude and output phase, respectively, as a function of input frequency. FIR filter 161 may be designed to have such filtering.

Figure 21:
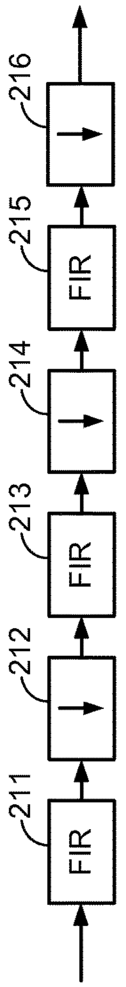
FIG. 21 is a block diagram illustrating a cascade of FIR filters and down samplers, which may be another alternative to CIC decimators consistent with this disclosure.

In still other examples, the CIC decimator described above may be replaced with a cascade of FIR filters and down samplers, such as shown in FIG. 21. In this case, FIR filter 211, down sampler 212, FIR filter 213, down sampler 214, FIR filter 215, down sampler 216 may replace the CIC decimator discussed herein to achieve the necessary delay.

The delay and down sample ratio of each stage of cascaded FIR filters and down samplers may be selected to correctly achieve the desired overall delay and down sample ratio. For example, if each the FIR has a delay of N taps and the down sampler has a down sample ratio or R, then the overall down sample ratio would be $R^3$ and the overall delay would be $N+N\times R+N\times R^2$ for a chain of 3 stages of FIR-down sampler pairs, as shown in FIG. 21.

Figure 22:
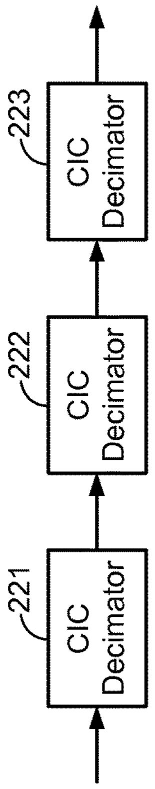
FIG. 22 illustrates three cascaded CIC decimators in series, consistent with and example of this disclosure.

In yet, another example the CIC decimator described herein may be replaced by a cascade of CIC decimators in order define the amount of delay needed for a given active noise cancellation circuit configuration. FIG. 22 illustrates three cascaded CIC decimators 221, 222 and 223, although any number of CIC decimators could be used. The parameters of CIC decimators 221, 222 and 223 could be tuned to provide the same amount of delay, or different amounts of delay for CIC decimators 221, 222 and 223. The delay and down sample ratio of each CIC may be defined to achieve the desired overall delay and down sample ratio. For example, if each CIC has a delay of N taps and down sample ratio R. The overall down sample ratio would be $R^3$ and the overall delay would be $N+N\times R+N\times R^2$ for a chain for 3 CICs.

Figure 23:
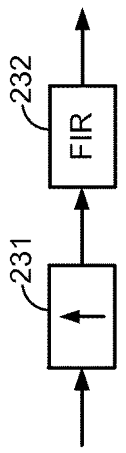
FIG. 23 is a block diagram showing an alternative to CIC interpolators consistent with this disclosure.

Like the CIC decimators, the CIC interpolators described herein may be combined with additional filters, or may be replaced with other types of up sample units to achieve a portion of the desired delay. One such up sample configuration is shown in FIG. 23, which comprises an up sampler 231 followed by an FIR filter 232. FIR filter 232 may be symmetric to give a constant group delay for all frequencies. FIR filters similar or identical to those used in down sampling described above, can be used in the up sampling In this case, the FIR filter 232 may perform lowpass filtering to prevent or remove any imaging effects of the in band signal to the out of band high frequency signal in the output during up sampling. Up sampler 231 may insert R−1 zeros between every sample such that the output signal has a sampling rate R times of the input signal.

Figure 24:
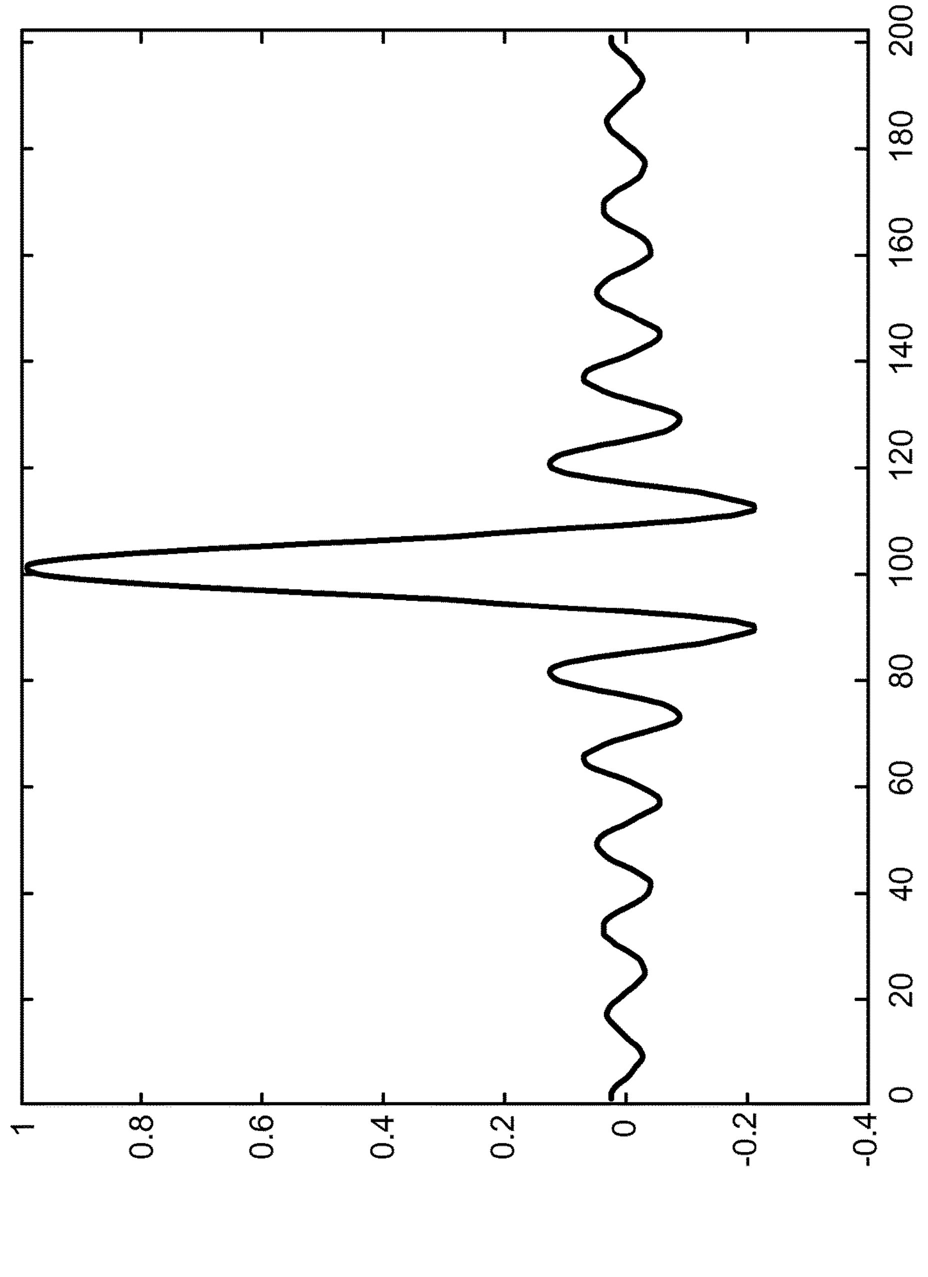
FIGS. 24 and 25 are graphs demonstrating operation of an FIR filter of the circuit shown in FIG. 23 consistent with this disclosure.
Figure 25:
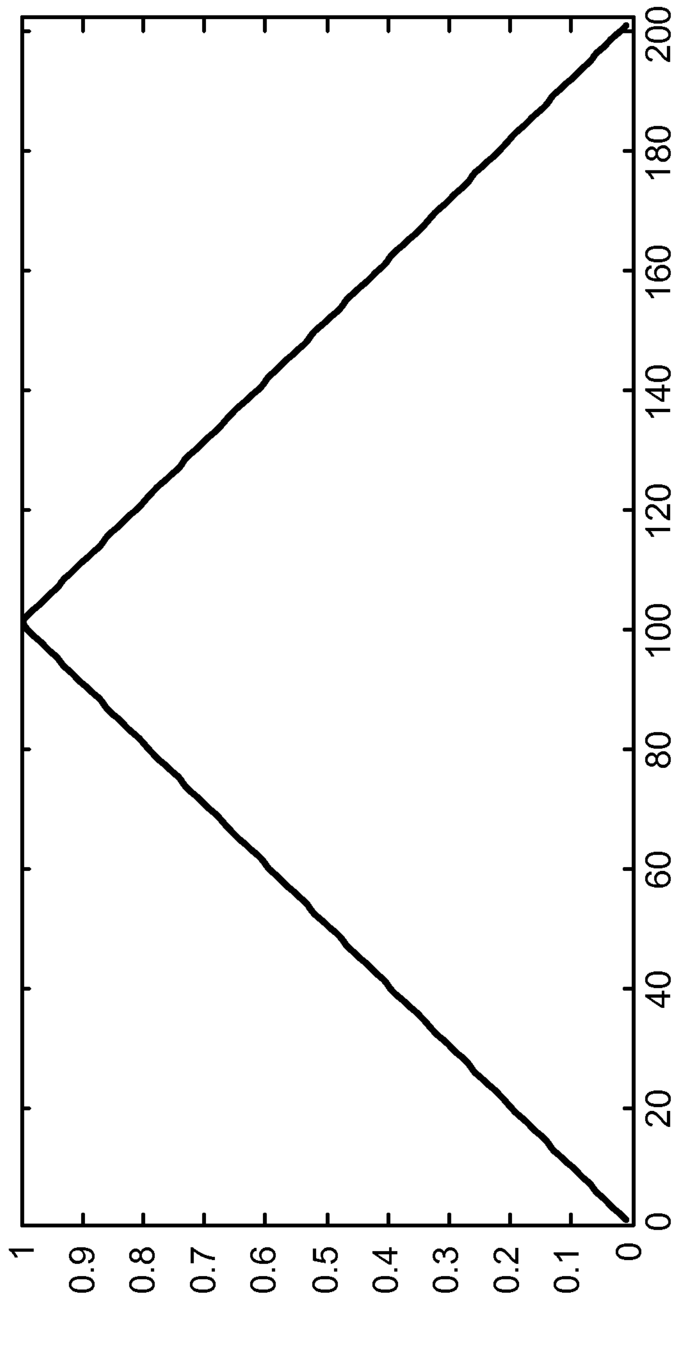

The length FIR filter 232 may be set to provide desired delay. Usually, if a delay of N taps is required, the length of the filter would be 2N−1 taps. One example of a feasible FIR filter for filter 232 is shown by the graphs of FIGS. 24 and 25. FIGS. 24 and 25 carry similar meaning to FIG. 17. The two graphs draw the shape of the FIR filter. Here the x-axis is the index to the filter taps, and y-axis is the value of filter taps coefficients. FIR filter 232 may be designed to achieve such filtering. The FIR filter output demonstrated by the graphs of FIGS. 24 and 25 may allow for up sampling from 8 kHz to 64 kHz with suppression of imaging signals.

Figure 26:
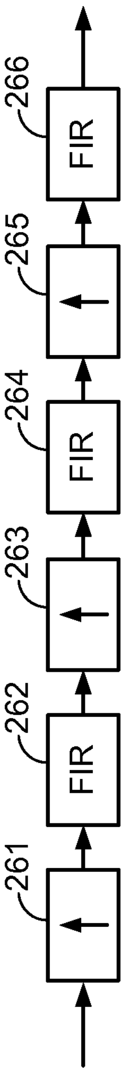
FIG. 26 is a block diagram illustrating a cascade of up samplers and FIR filters, which may be another alternative to CIC interpolators consistent with this disclosure.

As with the CIC decimator, the CIC interpolator described above may also be replaced with up samplers and FIR filters, such as shown in FIG. 26. In this case, up sampler 261, FIR filter 262, up sampler 263, FIR filter 264, up sampler 265 and FIR filter 266 may replace the CIC interpolator discussed herein to achieve the necessary delay. The delay and up sample ratio of each stage of cascaded up samplers and FIR filters may be selected to correctly achieve the desired overall delay and down sample ratio. For example, if each the FIR filters has a delay of N taps and the up samplers have an up sample ratio or R, then the overall up sample ratio would be $R^3$ and the overall delay would be $N+N\times R+N\times R^2$ for a chain of 3 stages of up sampler-FIR filter pairs, as shown in FIG. 26. Any numbers of pairs of up samplers and FIR filters may be used.

Figure 27:
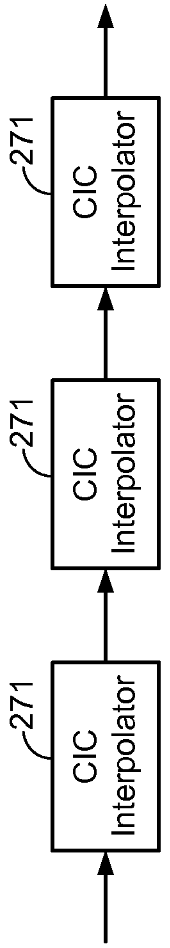
FIG. 27 illustrates three cascaded CIC interpolators in series, consistent with an example of this disclosure.

In yet another example the CIC interpolator described herein may be replaced by a cascade of CIC interpolators in order define the amount of delay needed for a given active noise cancellation circuit configuration. FIG. 27 illustrates three cascaded CIC interpolators 271, 272 and 273, although any number of CIC interpolators could be used. The parameters of CIC interpolators 271, 272 and 273 could be tuned to provide the same amount of delay, or different amounts of delay for CIC interpolators 271, 272 and 273. The delay and up sample ratio of each CIC interpolator may be defined to achieve the desired overall delay and up sample ratio. For example, if each CIC interpolator has a delay of N taps and an up sample ratio R, then the overall up sample ratio would be $R^3$ and the overall delay would be $N+N\times R+N\times R^2$ for a chain for three CIC interpolators.

The techniques of this disclosure may be implemented in a wide variety of devices or apparatuses, including a wireless communication device handset such as a mobile phone, an integrated circuit (IC) or a set of ICs (i.e., a chip set). Any components, modules or units have been described provided to emphasize functional aspects and does not necessarily require realization by different hardware units. The techniques described herein may also be implemented in hardware, software, firmware, or any combination thereof. Any features described as modules, units or components may be implemented together in an integrated logic device or separately as discrete but interoperable logic devices. In some cases, various features may be implemented as an integrated circuit device, such as an integrated circuit chip or chipset.

If implemented in software, the techniques may be realized at least in part by a computer-readable medium comprising instructions that, when executed in a processor, performs one or more of the methods described above. The computer-readable medium may comprise a computer-readable storage medium and may form part of a computer program product, which may include packaging materials. The computer-readable storage medium may comprise random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates code in the form of instructions or data structures and that can be accessed, read, and/or executed by a computer.

Any of the circuits described herein may be controlled at least in part by a processor that executes instructions stored on a computer-readable storage medium, such as described above. According, this disclosure contemplates a computer-readable storage medium comprising instructions that upon execution in a processor cause the processor to perform active noise cancellation, wherein the instructions cause the processor to process a sample via a down sample unit and an up sample unit, wherein a combined delay associated with processing a sample via the down sample unit and the up sample unit corresponds to a pre-defined delay that is selected to promote active noise cancellation. The combined delay may comprise a tunable parameter of a circuit that includes the down sample unit and the up sample unit, wherein the instructions cause the processor to select the tunable parameter.

The code or instructions may be executed by one or more processors, such as one or more digital signal processors (DSPs), general purpose microprocessors, an application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated software modules or hardware modules configured for encoding and decoding, or incorporated in a combined video codec. Also, the techniques could be fully implemented in one or more circuits or logic elements.

The disclosure also contemplates any of a variety of integrated circuit devices that include circuitry to implement one or more of the techniques described in this disclosure. Such circuitry may be provided in a single integrated circuit chip or in multiple, interoperable integrated circuit chips in a so-called chipset. Such integrated circuit devices may be used in a variety of applications, some of which may include use in wireless communication devices, such as mobile telephone handsets.

Various examples have been described in this disclosure. The circuits described herein have exemplary numbers of stages, amplifiers, and down sampling and up sampling ratios illustrated, but different numbers of filter stages, amplifiers, or down sampling and up sampling ratios could be used for other configurations consistent with this disclosure.

Furthermore, although the delay techniques of this disclosure are primarily described in the context of active noise cancellation, the delay techniques may also be used in other circuits (i.e., circuits that do not perform active noise cancellation). For example, the delay techniques using a down sample unit and an up sample unit, rather than memory-based delay circuits, may also be used in low-latency equalization circuits or other circuits.

These and other examples are within the scope of the following claims.

The invention claimed is:

1. An apparatus comprising:

a down sample unit; and an up sample unit, wherein the down sample unit and the up sample unit combined together produce a combined delay, wherein the down sample unit and the up sample unit are each tunable such that the combined delay associated with processing a sample via the down sample unit and the up sample unit corresponds to a delay associated with one or more tap delays of a filter configured to filter samples in a down-sampled domain, and wherein the combined delay associated with processing the sample via the down sample unit and the up sample unit is tunable based on a sampling ratio of the down sample unit and the up sample unit.

2. The apparatus of claim 1, wherein the combined delay is a tunable parameter of the apparatus.

3. The apparatus of claim 1, wherein the apparatus comprises an active noise cancellation circuit configured to perform active noise cancellation, and wherein the delay is selected to promote the active noise cancellation.

4. The apparatus of claim 1, wherein the up sample unit follows the down sample unit to provide the combined delay.

5. The apparatus of claim 1, wherein the down sample unit comprises a cascaded integration combiner (CIC) decimator and the up sample unit comprises a CIC interpolator.

6. The apparatus of claim 1, wherein the combined delay is also based on fixed values for a stage number (N) and a differential delay (M) for the down sample unit and the up sample unit.

7. The apparatus of claim 1, further comprising a set of amplifiers, adders and delay elements that define one or more filters comprising the filter and that filter the output of the down sample unit and provide input to the up sample unit, wherein the combined delay corresponds to a predefined delay that matches a delay associated with the one or more filters.

8. The apparatus of claim 1, wherein the down sample unit and the up sample unit are each tunable to produce one-half of the combined delay.

9. The apparatus of claim 1, wherein the apparatus comprises an active noise cancellation circuit that includes the down sample unit and the up sample unit to generate the delay, wherein the combined delay corresponds to a predefined delay that is selected to promote active noise cancellation, the apparatus further comprising a microphone that captures audio information, a digital-to-analog converter that converts the captured audio information into samples, and a speaker that outputs anti-noise generated by the active noise cancellation circuit.

10. The apparatus of claim 1, further comprising one or more scaling amplifiers.

11. A method of performing active noise cancellations, the method comprising:

processing a sample via a circuit comprising a down sample unit and an up sample unit, wherein the down sample unit and the up sample unit combined together produce a combined delay, wherein the down sample unit and the up sample unit are each tunable such that the combined delay associated with processing a sample via the down sample unit and the up sample unit corresponds to a delay that is selected to promote active noise cancellation, wherein the delay corresponds to a delay associated with one or more tap delays of a filter configured to filter samples in a down-sampled domain, and wherein the combined delay associated with processing the sample via the down sample unit and the up sample unit is tunable based on a sampling ratio of the down sample unit and the up sample unit.

12. The method of claim 11, wherein the combined delay is a tunable parameter of a circuit that includes the down sample unit and the up sample unit.

13. The method of claim 11, wherein the circuit comprises an active noise cancellation circuit.

14. The method of claim 11, wherein the up sample unit follows the down sample unit to create the combined delay.

15. The method of claim 11, wherein the down sample unit comprises a cascaded integration combiner (CIC) decimator and the up sample unit comprises a CIC interpolator.

16. The method of claim 11, wherein the combined delay is also based on fixed values for stage number N and differential delay M for the down sample unit and the up sample unit.

17. The method of claim 11, wherein one or more filters comprising the filter comprises a set of amplifiers, adders and delay elements that define the one or more filters and that filter the output of the down sample unit and provide input to the up sample unit, wherein the combined delay that corresponds to the delay matches a delay associated with the one or more filters.

18. The method of claim 11, wherein the down sample unit and the up sample unit are each tunable to produce one-half of the combined delay.

19. The method of claim 11, wherein the down sample unit and the up sample unit form part of an active noise cancellation circuit that generates anti-noise, the method further comprising:

capturing audio information, converting the captured audio information into samples, processing the samples via the active noise cancellation circuit to generate the anti-noise;

and outputting the anti-noise generated by the active noise cancellation circuit.

20. A device comprising:

means for down sampling; and means for up sampling, wherein the means for down sampling and the means for up sampling combined together produce a combined delay, wherein the means for down sampling and the means for up sampling are each tunable such that the combined delay associated with the means for down sampling and the means for up sampling corresponds to a delay associated with one or more tap delays of a filter configured to filter samples in a down-sampled domain, and wherein the combined delay associated with processing the sample via the means for down sampling and the means for up sampling is tunable based on a sampling ratio of the means for down sampling and the means for up sampling.

21. The device of claim 20, wherein the combined delay is a tunable parameter of the device.

22. The device of claim 20, wherein the device comprises an active noise cancellation circuit configured to perform active noise cancellation, wherein the delay is pre-selected to promote the active noise cancellation.

23. The device of claim 20, wherein the means for up sampling follows the means for down sampling to provide the combined delay.

24. The device of claim 20, wherein the means for down sampling comprises a cascaded integration combiner (CIC) decimator and the means for up sampling comprises a CIC interpolator.

25. The device of claim 20, wherein the combined delay is also based on fixed values for a stage number (N) and a differential delay (M) for the means for down sampling and the means for up sampling.

26. The device of claim 22, further comprising a set of amplifiers, adders and delay elements that define one or more filters comprising the filter and that filter the output of the means for down sampling and provide input to the means for up sampling, wherein the combined delay that corresponds to the delay matches a delay associated with the one or more filters.

27. The device of claim 20, wherein the means for down sampling and the means for up sampling are each tunable to produce one-half of the combined delay.

28. The device of claim 20, wherein the device comprises an active noise cancellation circuit that includes the means for down sampling and the means for up sampling, wherein the combined delay corresponds to a predefined delay that is selected to promote the active noise cancellation, the device further comprising a microphone that captures audio information, a digital-to-analog converter that converts the captured audio information into samples, and a speaker that outputs anti-noise generated by the active noise cancellation circuit.

29. A non-transitory computer-readable storage medium comprising instructions that upon execution in a processor cause the processor to perform active noise cancellation, wherein the instructions cause the processor to:

process a sample via a circuit comprising a down sample unit and an up sample unit, wherein the down sample unit and the up sample unit combined together produce a combined delay, wherein the down sample unit and the up sample unit are each tunable such that the combined delay associated with processing a sample via the down sample unit and the up sample unit corresponds to a delay associated with one or more tap delays of a filter configured to filter samples in a down-sampled domain, and wherein the combined delay associated with processing the sample via the down sample unit and the up sample unit is tunable based on a sampling ratio of the down sample unit and the up sample unit.

30. The non-transitory computer-readable storage medium of claim 29, wherein the combined delay is a tunable parameter of a circuit that includes the down sample unit and the up sample unit, wherein the instructions cause the processor to select the tunable parameter.

31. The non-transitory computer-readable storage medium of claim 29, wherein the circuit comprises an active noise cancellation circuit and the processor selects the delay for the circuit.

32. The non-transitory computer-readable storage medium of claim 29, wherein the up sample unit follows the down sample unit to create the combined delay.

33. The non-transitory computer-readable storage medium of claim 29, wherein the down sample unit comprises a cascaded integration combiner (CIC) decimator and the up sample unit comprises a CIC interpolator.

34. The non-transitory computer-readable storage medium of claim 29, wherein the combined delay is also based on fixed values for stage number N and differential delay M for the down sample unit and the up sample unit, wherein the instructions cause the processor to tune the combined delay based on N and M.

35. The non-transitory computer-readable storage medium of claim 29, wherein the instructions cause the processor to process the sample via a set of amplifiers, adders and delay elements that define one or more filters comprising the filter and that filter the output of the down sample unit and provide input to the up sample unit, wherein the combined delay corresponds to a predefined delay that matches a delay associated with the one or more filters.

36. The non-transitory computer-readable storage medium of claim 29, wherein the down sample unit and the up sample unit are each tunable to produce one-half of the combined delay.

37. The non-transitory computer-readable storage medium of claim 29, wherein the down sample unit and the up sample unit form part of an active noise cancellation circuit that generates anti-noise, wherein the instructions cause the processor to:

capture audio information, convert the captured audio information into samples, process the samples via the active noise cancellation circuit to generate the anti-noise; and output the anti-noise generated by the active noise cancellation circuit.

* * * * *